(12) United States Patent
Lynch et al.

(10) Patent No.: US 11,247,286 B2
(45) Date of Patent: Feb. 15, 2022

(54) PASTE DISPENSING TRANSFER SYSTEM AND METHOD FOR A STENCIL PRINTER

(71) Applicant: Illinois Tool Works Inc., Glenview, IL (US)

(72) Inventors: James Lynch, Uxbridge, MA (US); William A. Losiewicz, Douglas, MA (US); Kenneth J. King, East Freetown, MA (US); Patsy A. Mattero, Smithfield, RI (US); Blake T. Monjar, Franklin, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 16/898,909

(22) Filed: Jun. 11, 2020

(65) Prior Publication Data

US 2020/0391315 A1    Dec. 17, 2020

Related U.S. Application Data

(60) Provisional application No. 62/931,496, filed on Nov. 6, 2019, provisional application No. 62/861,025, filed on Jun. 13, 2019.

(51) Int. Cl.
| | |
|---|---|
| *B41F 15/12* | (2006.01) |
| *B41F 15/40* | (2006.01) |
| *B23K 3/06* | (2006.01) |
| *H05K 3/12* | (2006.01) |

(52) U.S. Cl.
CPC ............ *B23K 3/0638* (2013.01); *B41F 15/12* (2013.01); *B41F 15/40* (2013.01); *H05K 3/1233* (2013.01)

(58) Field of Classification Search
CPC .......... B41F 15/14; B41F 15/12; B41F 15/40; B41F 15/08
See application file for complete search history.

(56) References Cited

U.S. PATENT DOCUMENTS

| | | | |
|---|---|---|---|
| 3,779,161 | A | 12/1973 | Tatebe |
| 4,195,567 | A | 4/1980 | Mitter |
| 4,362,486 | A | 12/1982 | Davis et al. |

(Continued)

FOREIGN PATENT DOCUMENTS

| | | |
|---|---|---|
| CN | 207266515 U | 4/2018 |
| JP | H04197684 A | 7/1992 |

(Continued)

OTHER PUBLICATIONS

Notification of Transmittal of the International Search Report and the Written Opinion of the International Searching Authority from corresponding PCT/US2020/037362 dated Sep. 28, 2020.

*Primary Examiner* — Leslie J Evanisko
(74) *Attorney, Agent, or Firm* — Lando & Anastasi, LLP

(57) ABSTRACT

A paste dispensing transfer system of a stencil printer is configured to print an assembly material on an electronic substrate. The transfer system includes a paste cartridge mechanism coupled to a print head assembly of the stencil printer, and a rotary indexing mechanism coupled to a frame of the stencil printer. The paste dispensing transfer system is configured to transfer a used paste cartridge from the print head assembly to the rotary indexing mechanism supported by the frame and to transfer a new paste cartridge from the rotary indexing mechanism to the print head assembly.

26 Claims, 20 Drawing Sheets

(56) References Cited

U.S. PATENT DOCUMENTS

| | | |
|---|---|---|
| 4,924,304 A | 5/1990 | Freeman |
| 5,044,306 A | 9/1991 | Erdmann |
| 5,265,773 A | 11/1993 | Harada |
| 5,392,710 A | 2/1995 | Li |
| 5,669,970 A | 9/1997 | Balog et al. |
| 5,947,022 A | 9/1999 | Freeman et al. |
| 8,033,216 B2 | 10/2011 | Chen |
| 2001/0044979 A1 | 11/2001 | Ravkin |
| 2002/0019680 A1 | 2/2002 | Nishikawa et al. |
| 2002/0020346 A1 | 2/2002 | Doyle et al. |
| 2004/0089174 A1 | 5/2004 | Ghisalberti et al. |
| 2004/0217166 A1 | 11/2004 | Myers et al. |
| 2007/0175343 A1 | 8/2007 | Prince |
| 2012/0145014 A1 | 6/2012 | Doyle |
| 2012/0175383 A1 | 7/2012 | Engels et al. |
| 2017/0158431 A1 | 6/2017 | Hamilton et al. |
| 2018/0009247 A1 | 1/2018 | Atwood et al. |
| 2020/0391499 A1 | 12/2020 | Lynch et al. |

FOREIGN PATENT DOCUMENTS

| | | | |
|---|---|---|---|
| JP | 2000103031 A | 4/2000 | |
| KR | 10-1517387 B1 | 5/2015 | |
| KR | 20150066215 A | 6/2015 | |
| KR | 20180092220 A * | 8/2018 | |
| WO | 2018105018 A1 | 6/2018 | |
| WO | WO-2018105016 A1 * | 6/2018 | .............. B41F 35/00 |

* cited by examiner

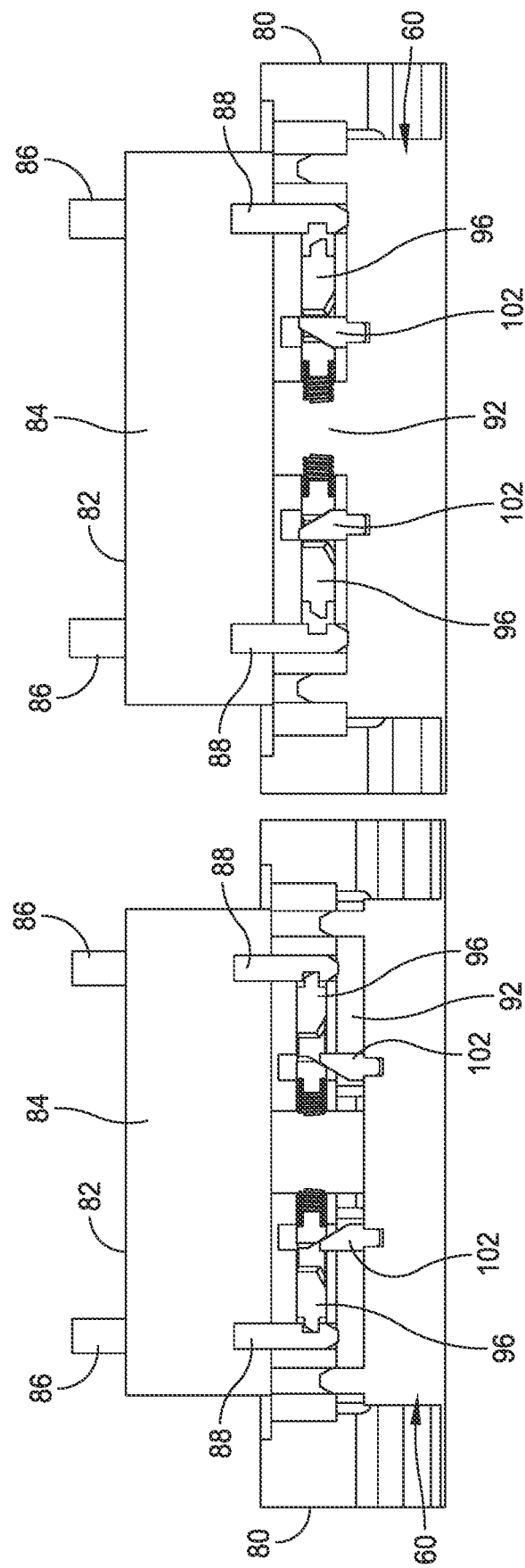

PASTE DISPENSING TRANSFER SYSTEM AND METHOD FOR A STENCIL PRINTER

CROSS-REFERENCE TO RELATED APPLICATIONS

This application claims the benefit under 35 U.S.C. § 119(e) of U.S. Provisional Patent Application No. 62/931, 496 titled MULTI-FUNCTIONAL PRINT HEAD FOR A STENCIL PRINTER filed on Nov. 6, 2019, and to U.S. Provisional Patent Application No. 62/861,025 titled METHOD AND SYSTEM FOR AUTOMATED CHANGEOVER AND REPLACEMENT WITHIN A STENCIL PRINTER filed on Jun. 13, 2019, which are incorporated herein by reference in their entirety for all purposes.

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to systems and methods for fully automating such stencil printers and methods.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate positions can prevent electrical contact. Generally, the vision inspection system is further employed to provide a two-dimensional or a three-dimensional inspection of the solder paste on the circuit board.

Present day stencil printers require manual intervention to perform routine operations. For example, during a changeover, an operator must perform many manual tasks, such as changing a stencil, replacing a solder paste cartridge, replacing squeegee blades, and replacing support tooling. Each of these tasks require the operator to manually perform the task. For example, with most stencil printers, the operator must unlock the stencil, remove the stencil, properly insert a replacement stencil, and lock the replacement stencil in place. A changeover operation can take as long as 30 minutes, during which the stencil printer is not operating, which may result in the PCB fabrication line not operating.

Stencil printers further require manual intervention to perform replacement and/or replenishment operations. For example, solder paste cartridges, which supply temperature-controlled solder paste to the stencil printer, require replacement over time, e.g., within four hours or less. Items subject to normal wear and tear, such as squeegee blades and stencils, may require periodic replacement when damaged.

SUMMARY OF THE DISCLOSURE

One aspect of the present disclosure is directed to a stencil printer for printing an assembly material on an electronic substrate. In one embodiment, the stencil printer comprises a frame, a stencil coupled to the frame, the stencil having apertures formed therein, and a support assembly coupled to the frame, the support assembly including tooling configured to support the electronic substrate in a print position beneath the stencil. The stencil printer further comprises a print head assembly coupled to the frame in such a manner that the print head assembly is configured to traverse the stencil during print strokes. The print head assembly includes a squeegee blade assembly and at least one paste cartridge to deposit assembly material on the stencil. The stencil printer further comprises a paste dispensing transfer system including a paste cartridge mechanism coupled to the print head assembly, and a rotary indexing mechanism coupled to the frame. The paste dispensing transfer system is configured to transfer a used paste cartridge from the print head assembly to the rotary indexing mechanism supported by the frame and to transfer a new paste cartridge from the rotary indexing mechanism to the print head assembly.

Embodiments of the stencil printer further may include configuring the rotary indexing mechanism with a carousel mount configured to rotate and a paste cartridge tube holder mounted on a top surface of the carousel mount. The tube holder may include a half-wall that is configured to provide lateral support to a paste cartridge to maintain the paste cartridge in a vertical, upright position. The rotary indexing mechanism further may include several dividers provided to separate the paste cartridges supported by the rotary indexing mechanism from each other. The rotary indexing mechanism may be configured to be rotated to present an open receptacle defined between two adjacent dividers to receive the used paste cartridge. The rotary indexing mechanism may be configured to be rotated to present a new paste cartridge to transfer to print head assembly. The rotary indexing mechanism further may include a mounting bracket configured to secure the rotary indexing mechanism to a support member of the frame. The rotary indexing mechanism further may include a motor and bearing housing secured to a bottom of the mounting bracket to secure a motor and gear box assembly, and a shaft coupled to the motor bearing housing and the carousel mount to drive the rotation of the carousel mount. The paste cartridge mechanism may include a support bracket mounted on a support member of the print head assembly and an actuator secured to the support bracket to move the support bracket in a z-axis direction. The support bracket may include an end effector having a base with a receiving feature designed to receive a bottom portion of the nozzle of the paste cartridge, with the end effector being configured to selectively engage and secure the nozzle of the paste cartridge and maintain the paste cartridge in the vertical, upright position. The support bracket may be secured to the support member of the print head assembly by at least one linear bearing to enable the movement of the support bracket, actuator and end effector in the x-axis direction and is driven by a timing belt. The actuator may be configured to move the paste cartridge upwardly so that an open end of the paste cartridge is sealed by a cartridge sealing feature of the print head assembly. The end effector may include a receiving feature having two spaced-apart prongs that are sized to surround a narrow cylindrical portion of the nozzle of the paste cartridge to enable the end effector to support the paste cartridge in the upright, vertical position.

Another aspect of the present disclosure is directed to a method of fully automating a changeover and/or a replacement process within a stencil printer. In one embodiment, the method comprises: identifying a used paste cartridge scheduled for replacement within the stencil printer; transferring the used paste cartridge from a print head assembly with a paste cartridge mechanism to a rotary indexing mechanism; transferring a new paste cartridge from the rotary indexing mechanism to the paste cartridge mechanism; and installing the new paste cartridge within the print head assembly.

Embodiments of the method further may include transferring the used paste cartridge by presenting an open receptacle of the rotary indexing mechanism and moving the used paste cartridge to the open receptacle. Transferring a new paste cartridge may include presenting the new paste cartridge to the paste cartridge mechanism and moving the new paste cartridge to the paste cartridge mechanism. Installing the new paste cartridge may include moving the new paste cartridge in a z-axis direction to seal an open end of the paste cartridge.

Yet another aspect of the present disclosure is directed to a paste dispensing transfer system of a stencil printer configured to print an assembly material on an electronic substrate. In one embodiment, the transfer system comprises a paste cartridge mechanism coupled to a print head assembly of the stencil printer, and a rotary indexing mechanism coupled to a frame of the stencil printer. The paste dispensing transfer system is configured to transfer a used paste cartridge from the print head assembly to the rotary indexing mechanism supported by the frame and to transfer a new paste cartridge from the rotary indexing mechanism to the print head assembly.

Embodiments of the transfer assembly further may include configuring the rotary indexing mechanism with a carousel mount configured to rotate and a paste cartridge tube holder mounted on a top surface of the carousel mount. The tube holder may include a half-wall that is configured to provide lateral support to a paste cartridge to maintain the paste cartridge in a vertical, upright position. The rotary indexing mechanism further may include several dividers provided to separate the paste cartridges supported by the rotary indexing mechanism from each other. The rotary indexing mechanism may be configured to be rotated to present an open receptacle defined between two adjacent dividers to receive the used paste cartridge. The rotary indexing mechanism may be configured to be rotated to present a new paste cartridge to transfer to print head assembly. The rotary indexing mechanism further may include a mounting bracket configured to secure the rotary indexing mechanism to a support member of the frame. The rotary indexing mechanism further may include a motor and bearing housing secured to a bottom of the mounting bracket to secure a motor and gear box assembly, and a shaft coupled to the motor bearing housing and the carousel mount to drive the rotation of the carousel mount. The paste cartridge mechanism may include a support bracket mounted on a support member of the print head assembly and an actuator secured to the support bracket to move the support bracket in a z-axis direction. The support bracket may include an end effector having a base with a receiving feature designed to receive a bottom portion of the nozzle of the paste cartridge, with the end effector being configured to selectively engage and secure the nozzle of the paste cartridge and maintain the paste cartridge in the vertical, upright position. The support bracket may be secured to the support member of the print head assembly by at least one linear bearing to enable the movement of the support bracket, actuator and end effector in the x-axis direction and is driven by a timing belt. The actuator may be configured to move the paste cartridge upwardly so that an open end of the paste cartridge is sealed by a cartridge sealing feature of the print head assembly. The end effector may include a receiving feature having two spaced-apart prongs that are sized to surround a narrow cylindrical portion of the nozzle of the paste cartridge to enable the end effector to support the paste cartridge in the upright, vertical position.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 8A and 8B are cross-sectional views of a release mechanism configured to release the end effector from the squeegee blade holder;

DETAILED DESCRIPTION OF THE DISCLOSURE

Figure 1:
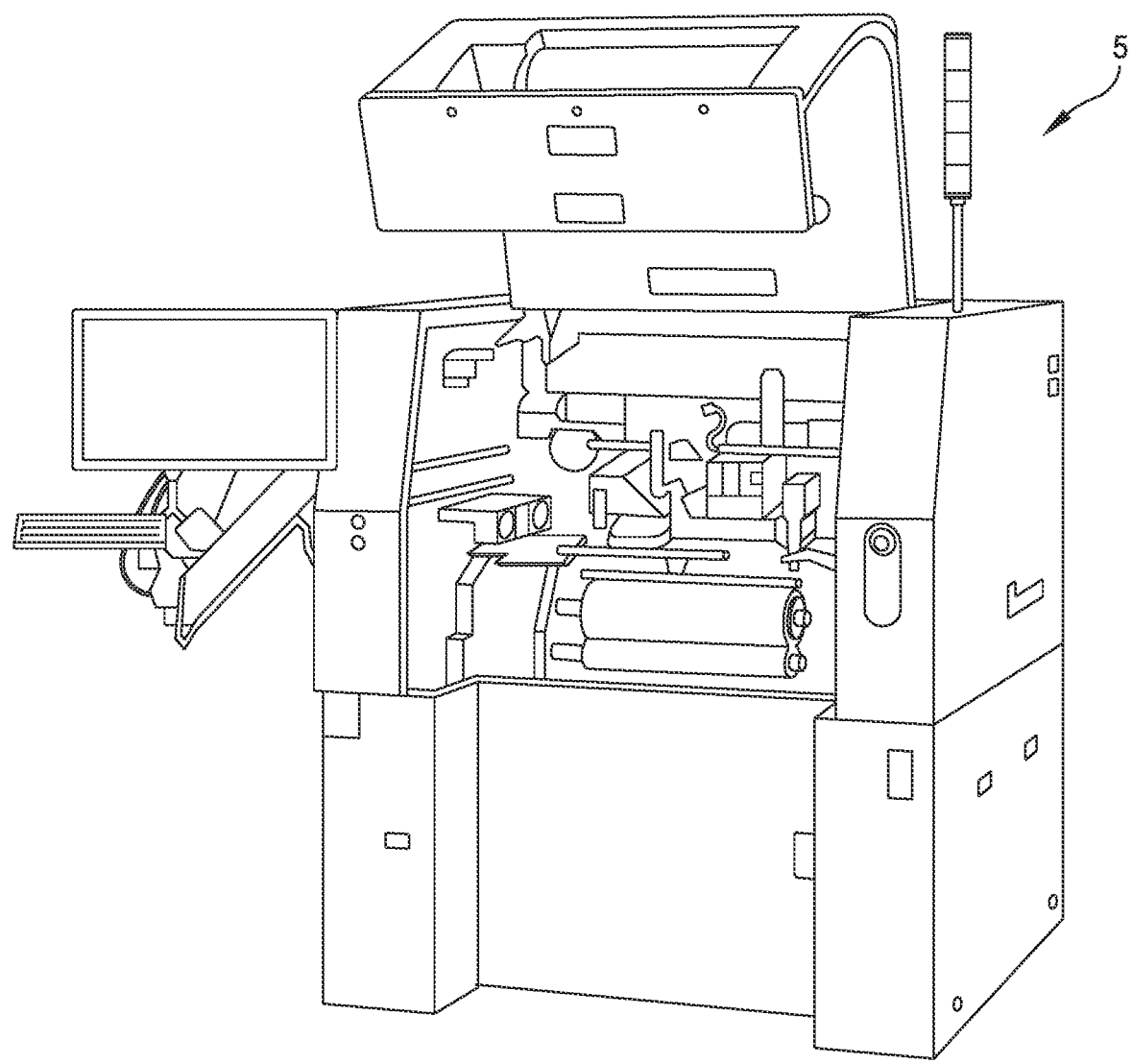
FIG. 1 is a front view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

For purposes of illustration, embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulents. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Mass. An exemplary stencil printer is generally designated at 5 in FIG. 1. In this embodiment, the stencil printer 5 is a Momentum® series stencil printer platform offered by ITW Electronic Assembly Equipment of Hopkinton, Mass.

Figure 2:
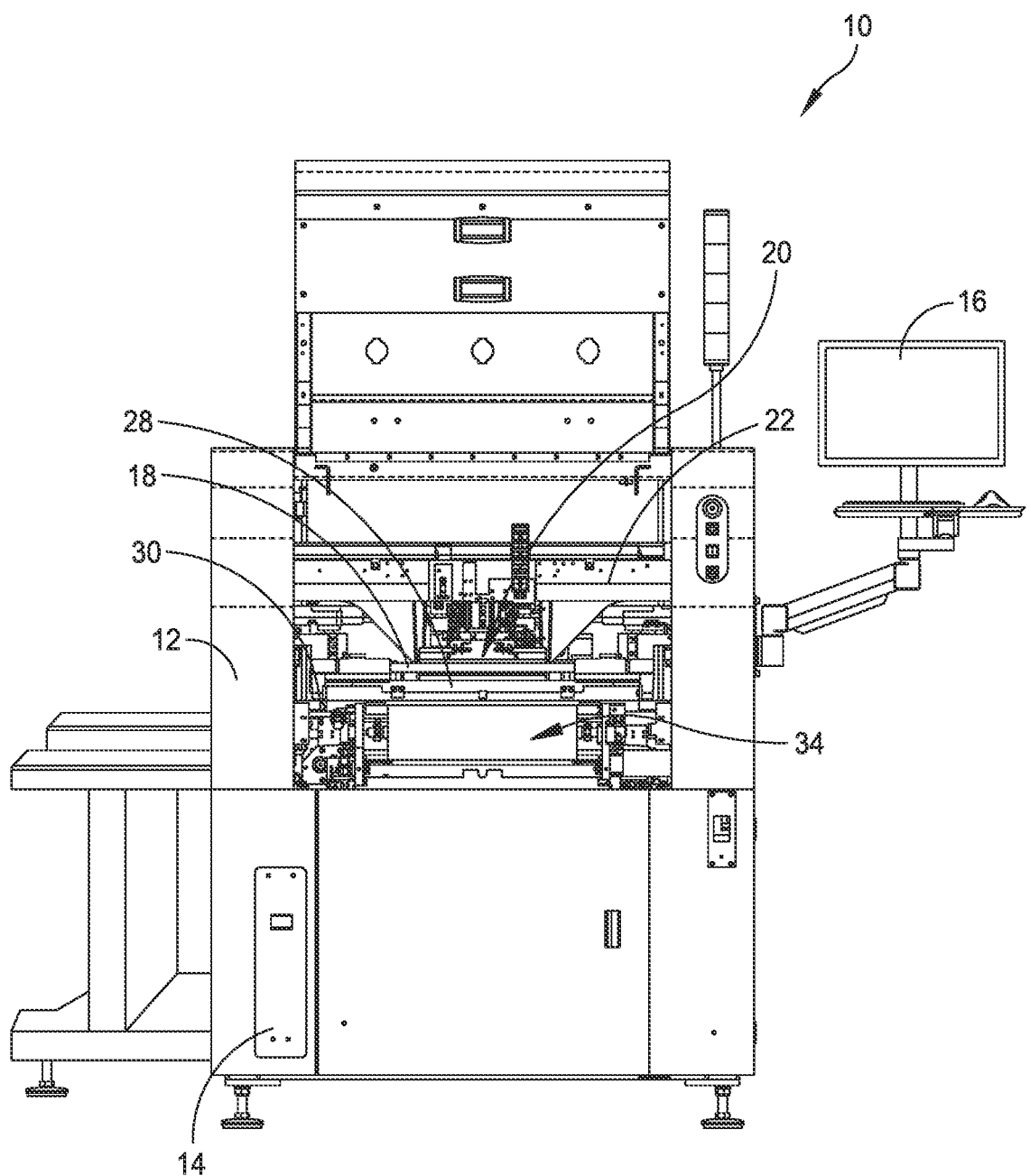
FIG. 2 is a front perspective view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry 22, which may be mounted on the frame 12. The print head assembly gantry 22 enables the print head assembly 20 to be moved in the y-axis direction under the control of the controller 14 and to apply pressure on the print head assembly as it engages the stencil 18. In a certain embodiment, the print head assembly 20 may be placed over the stencil 18 and may be lowered in the z-axis direction into contact and sealingly engage the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
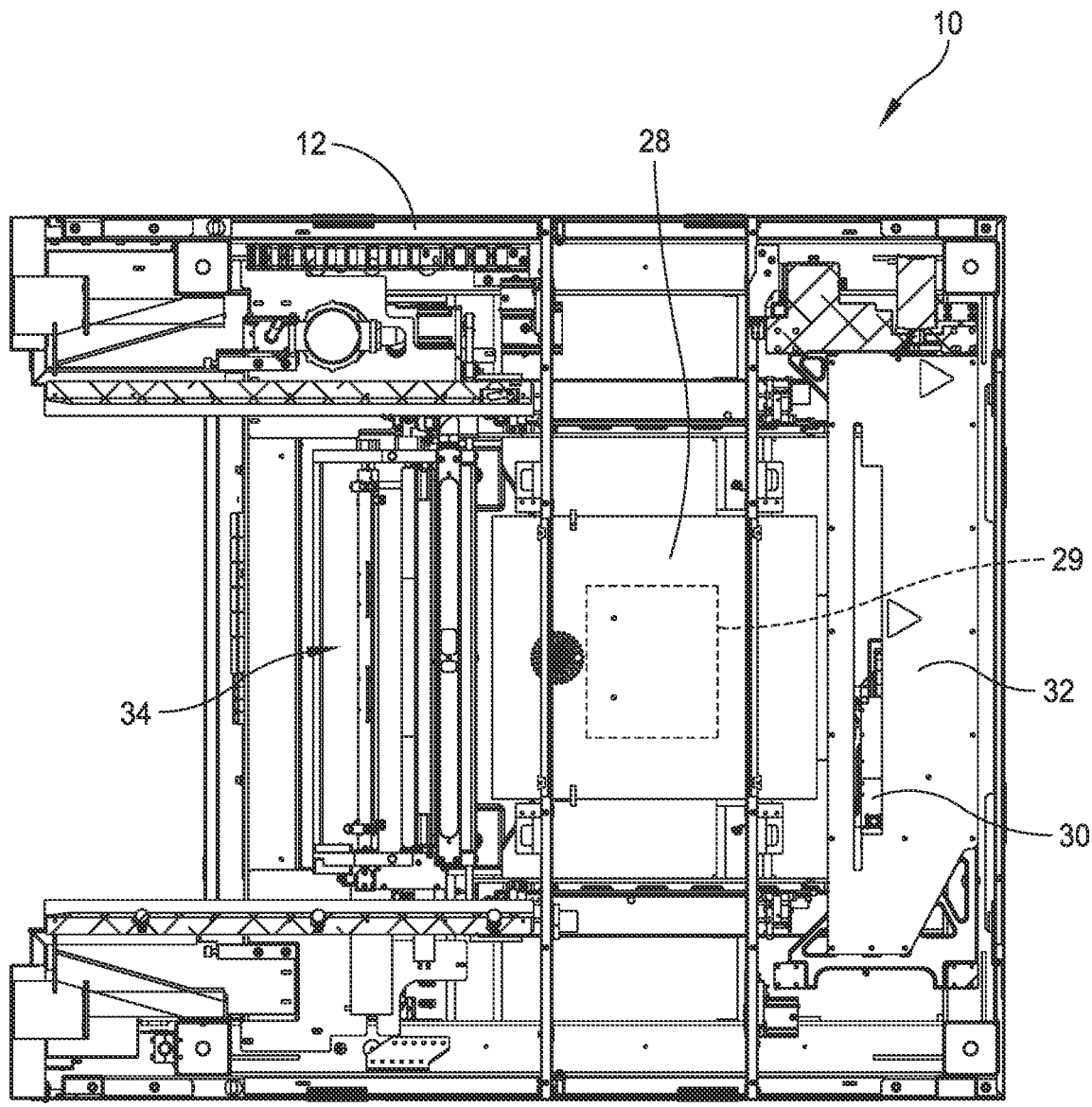
FIG. 3 is a top plan view of the stencil printer illustrated in FIG. 2 with portions removed.

Referring additionally to FIG. 3, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, that provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head assembly gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board 29 in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

As mentioned above, stencil printers require manual intervention to perform replacement of certain parts and/or replenishment operations. For example, a typical stencil requires replacement after a certain period of time, e.g., four hours. Also, stencils need replacement for separate production runs. In addition, solder paste cartridges, which supply temperature-controlled solder paste to the stencil printer, require replacement over time, e.g., within four hours or less. A separate production run may require a different solder paste material. Another item requiring periodic replacement is squeegee blades, which are subject to wearing during use. And finally, tooling used to support a substrate in a print position is subject to replacement when changing from one production product to another.

A system and method of replacing tooling used to support a substrate in a print position includes, either for a new production run or because of a defect detected with existing tooling, retrieving new tooling from a tooling stockroom and transported to one of several stencil printers. At the production line, the used tooling is removed from the stencil printer and the new tooling is inserted into the stencil printer and secured for use. The used tooling is transported to a station where the tooling is inspected, and if salvageable, cleaned for reuse. If defective, the tooling is scrapped in a responsible manner. Once cleaned, the tooling is transported back to the tooling stockroom, where the tooling is ready to be used during the same or different production run.

A system and method of replacing a squeegee blade or a pair of squeegee blades includes, either for a new production run or because of a defect detected with an existing squeegee blade, retrieving a new squeegee blade from a squeegee blade stockroom and transporting the new squeegee blade to one of several stencil printers. At the production line, the used squeegee blade is removed from the stencil printer and the new squeegee blade is inserted into the stencil printer and secured for use. The used squeegee blade is transported to a station where the squeegee blade is inspected, and if salvageable, cleaned for reuse. If defective, the squeegee blade is scrapped in a responsible manner. Once cleaned, the squeegee blade is transported back to the squeegee blade stockroom, where the squeegee blade is ready to be used during the same or different production run.

A system and method of replacing a paste cartridge, either for a new production run or because of exhaustion of an existing paste cartridge, includes retrieving a new paste cartridge from a paste cartridge stockroom and transporting the new paste cartridge to one of several stencil printers. The stencil printers can be part of a single production line used to fabricate printed circuit boards or part of several production lines. The number of stencil printers can vary. The storage of the paste cartridges in the stockroom and the transportation of the paste cartridge should take place in a temperature- and/or climate-controlled environment suitable to preserve the solder paste contained within the solder paste cartridges. At the production line, the "spent" or used paste cartridge is removed from the stencil printer and the "full" or new paste cartridge is inserted into the stencil printer and secured for use. The spent paste cartridge is transported to a station where the paste cartridge is saved (because it is not completely used) or saved for recycling. Once saved or recycled, the paste cartridge is transported back to the paste cartridge stockroom, where the paste cartridge is ready to be used during the same or different production run.

Embodiments of the present disclosure are directed to a delivery system that is configured to automate a changeover process for a stencil printer and to implement one or more of the systems and methods described herein. In one embodiment, the delivery system includes a movable cart that is configured to engage a stencil printer to supply and receive replacement and replenishment parts and materials to the stencil printer. For example, the stencil printer may include a docking station that is configured to receive the movable cart. The docking station may include an interface that enables the movable cart to communicate with the stencil printer. A single movable cart may be configured to include replacement support tooling, replacement squeegee blades, replenishment squeegee blades, replacement solder paste cartridges, and replenishment solder paste cartridges. During a changeover, for example, the stencil printer must be reconfigured to produce different items. Thus, a new support tool to accommodate a different substrate, new blades having different lengths, and a different type of solder paste may be employed within the stencil printer to produce a different product.

The changeover process described herein can be achieved by a single movable cart that is configured to replace and/or replenish each item. In other embodiments, more than one movable cart can be provided.

The movable cart, or another movable cart, is configured to support a predetermined number of tooling used to support a printed circuit board in a print position, which is selected for production runs anticipated for a particular day or a particular period of time. The movable cart and/or the stencil printer can be configured to identify the support tooling, store the support tooling, transport the support tooling to and from the stencil printer, inspect the support tooling, and interface with the stencil printer. The movable cart also may be configured to remove used parts, such as support tooling, from the stencil printer.

The movable cart, or another movable cart, is configured to support a predetermined number of squeegee blades, which are selected for production runs anticipated for a particular day or a particular period of time. The movable cart and/or the stencil printer can be configured to identify the squeegee blades, store the squeegee blades, transport the squeegee blades to and from the stencil printer, inspect the squeegee blades, and interface with the stencil printer. The movable cart also may be configured to remove used parts, such as squeegee blades, from the stencil printer.

The movable cart, or another movable cart, is configured to support a predetermined number of paste cartridges, which are selected for production runs anticipated for a particular day or a particular period of time. The movable cart and/or the stencil printer can be configured to identify the paste cartridges, store the paste cartridges in a suitable environment, transport the paste cartridges to and from the stencil printer, inspect the paste cartridges, and interface with the stencil printer. The movable cart also may be configured to remove used parts, such as paste cartridges, from the stencil printer. Moreover, the movable cart can be configured to store paste cartridges long term. In one embodiment, long term storage of solder paste can be achieved by refrigeration at 0 to 10° C. (32 to 50° F.). The paste cartridges can be stored at a location in the movable cart to maintain this temperature range. In another embodiment, the movable cart can be configured to pre-heat the paste cartridges prior to use to ready the cartridges for use in the stencil printer.

Figure 4:
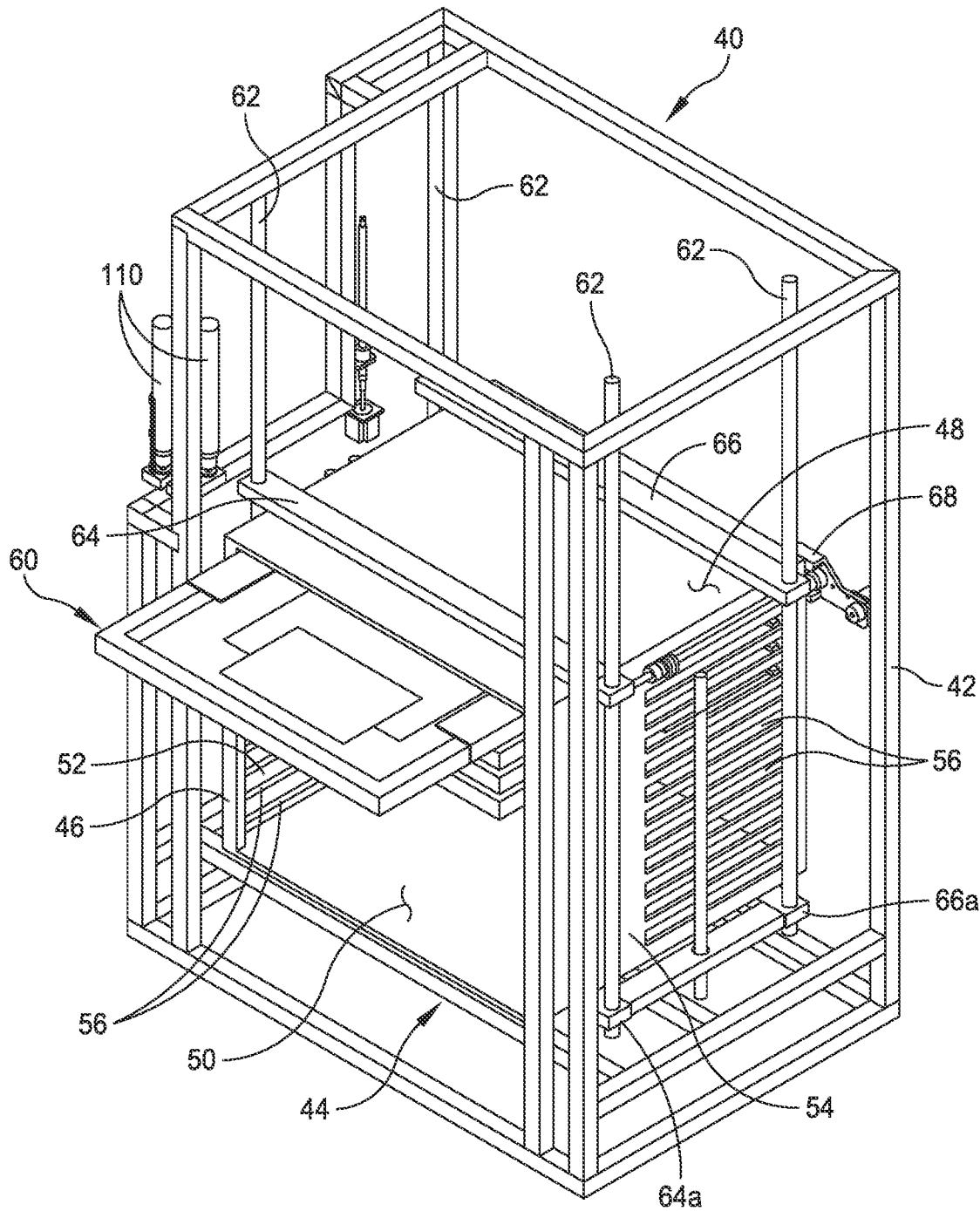
FIG. 4 is a perspective view of a removable cart of an embodiment of the disclosure, with external packaging removed to reveal interior structure of the movable cart.

Referring to FIG. 4, in one embodiment, a movable cart, generally indicated at 40, includes a frame or housing 42 configured to support replacement and/or replenishment items. As shown, the frame 42 is generally rectangular and is supported on wheels or casters (not shown). In one embodiment, the movable cart 40 is configured to be manually moved by an operator by pushing the frame 42 of the movable cart. In this embodiment, the movable cart 40 can be configured with a push bar or a handle. In another embodiment, the movable cart 40 is configured to be automatically moved, either by remote control or by an automated control associated with the movable cart, the stencil printer 10, the production line, and/or some other dedicated control. In this embodiment, the movable cart 40 can include wheels that are driven by a suitable motor and drive train, and a control associated with the movable cart, the stencil printer 10, the production line, and/or some other dedicated control is configured to control the movable cart. The movable cart 40 further can include one or more sensors and/or a vision system, e.g., cameras, to guide the movable cart from a stockroom, for example, to the stencil printer.

The movable cart 40 includes a translatable carriage, generally indicated at 44, that can be configured to support one or more items, such as replacement stencils, replacement support tooling, replacement and/or replenishment squeegee blades, and replacement and/or replenishment paste cartridges. The translatable carriage 44 includes a rectangular structure 46 having a top 48, a bottom 50, opposite sides 52, 54, an open front, and an open back. The sides 52, 54 of the structure 46 can includes slots, each indicated at 56, each slot being configured to receive and support opposite edges of a planar item, such as the stencil 18, or, in the shown embodiment, a tooling tray, generally indicated at 60. The structure 46 can be configured to receive several items, e.g., ten or more. The space between slots 56 can be sized to receive a standard stencil frame therein.

The translatable carriage 44 further includes four vertically oriented rods, each indicated at 62, positioned at the four corners of the structure 46. As shown, the top of the structure 46 includes two bar members 64, 66, with one bar member 64 being secured to the top 48 of the structure adjacent the open front of the structure and the other bar member 66 being secured to the top adjacent the open back. Similarly, the bottom of the structure 46 includes two bar members 64a, 66a, with one bar member 64a being secured to the bottom 50 of the structure adjacent the open front of the structure and the other bar member 66a being secured to the bottom adjacent the open back. Each bar member 64, 64a and 66, 66a includes two openings formed on opposite ends of the bar, with the openings being positioned to receive a respective rod therein. The arrangement is such that the structure 46 is capable of moving vertically with respect to the rods 62 to raise and lower the structure. A suitable mechanism can be provided to raise and lower the structure 46 under the control of a controller. For example, a ball screw drive assembly can be provided to move the structure 46 to position a "shelf" defined by a slot 56 adjacent the stencil printer 10. The "shelves" can be specifically designed to support the tooling tray 60, which can be configured to support items including, but not limited to new and used support tooling, new and used squeegee blades, and new and spent/used paste cartridges. Some shelves can include tooling trays 60 that are designated as "clean shelves" to support clean or new items ready to be used within the stencil printer 10. Some shelves can include tooling trays 60 that are designated as "dirty shelves" to support used items to be taken away from the stencil printer 10. As mentioned above, the space between the slots 56 can be spaced apart from one another specific distances to receive various items. For example, the shelves can be spaced apart ⅜-inch to 1½-inch from one another to accommodate stencil frame and tooling tray thicknesses.

The movable cart 40 can be configured with one or more devices used to transport items from the movable cart to the stencil printer 10 and from the stencil printer to the movable cart. For example, the device can include a transport arm 68 that is configured to push and retrieve stencils 18 and tooling trays 60 to and from the movable cart 40, respectively. For example, as shown in FIG. 4, the transport arm 68 is pushing the tooling tray 60 away from the movable cart 40, with the tooling tray being positioned to be received by the stencil printer. Any suitable mechanism can be provided to move the transport arm, such as a ball screw drive assembly.

Figure 5A:
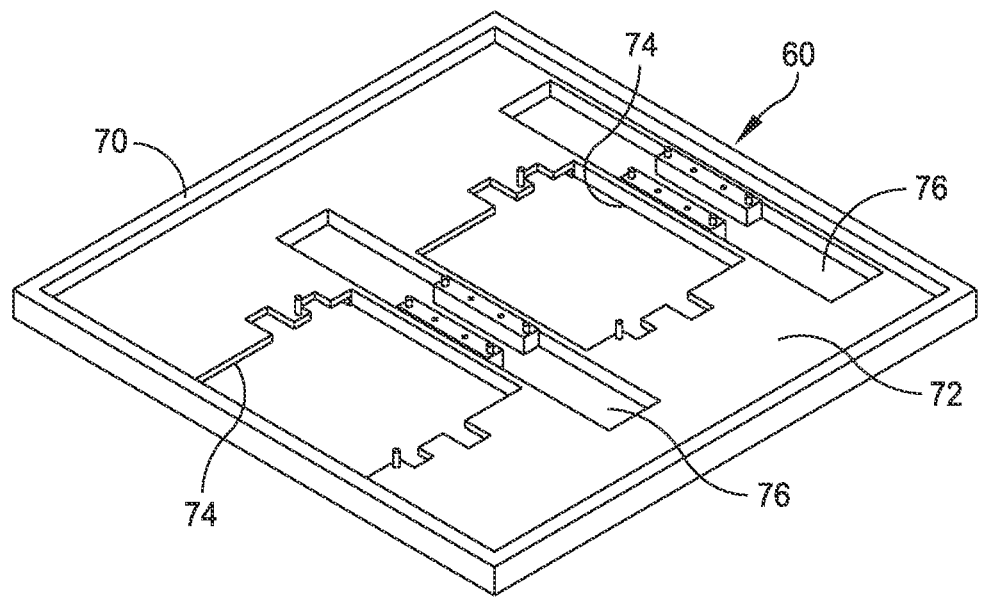
FIG. 5A is a perspective view of a tooling tray of an embodiment of the disclosure.
Figure 5B:
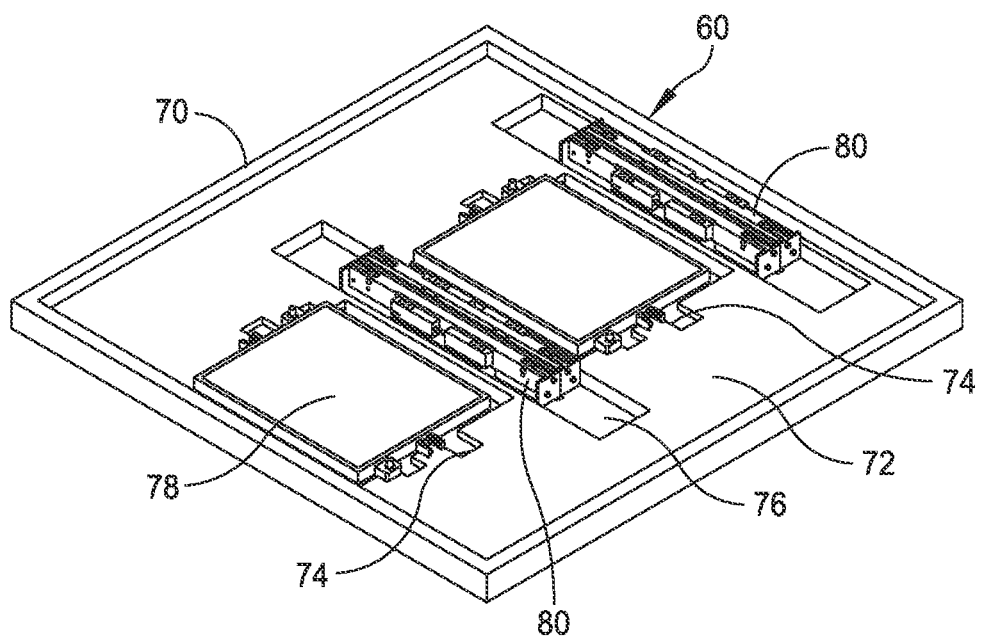
FIG. 5B is a perspective view of the tooling tray supporting tooling and squeegee blade assemblies.

Referring to FIGS. 5A and 5B, the tooling tray 60 includes a rectangular or square frame 70 and a planar body 72. The frame 70 can be sized to replicate the frame of the stencil 18. In one embodiment, the tooling tray 60 can be fabricated from lightweight yet strong material, such as an aluminum alloy. As shown in FIG. 5A, the body 72 of the tooling tray 60 can include several cut outs, each indicated at 74, and several recesses, each indicated at 76, to receive support tooling and squeegee blade assemblies, respectively. As shown in FIG. 5B, the cut outs 74 are configured to receive and secure support tooling, each indicated at 78, which is provided to support the electronic substrate 29 during a stencil print operation. The recesses 76 are configured to receive and secure squeegee blade assemblies, each indicated at 80, which are used by the print head assembly 20 to perform a stencil print operation.

As noted, the tooling tray 60 is substantially the same in form-factor as a stencil to permit handling and storage/retrieval of the tooling tray in substantially the same manner as a stencil. The movable cart 40 and the tooling tray 60 are particularly suited to handle stencils and tooling trays in a common manner. The movable cart 40 is configured to partially deliver the tooling tray 60 from the movable cart to the stencil printer 10, and the stencil printer is configured to receive the tooling tray the rest of the way. For example, the transport arm 68 can be used to push the tooling tray 60 away from the carriage 44 and to retrieve the tooling tray into the carriage.

In some embodiments, the tooling tray 60 can include fiducials, which can be viewed by the imaging system 30 of the stencil printer 10 to establish alignment to the parts and locations on the tooling tray. A method of aligning to the tooling tray 60 can be employed by capturing and analyzing fiducial locations.

Figure 6:
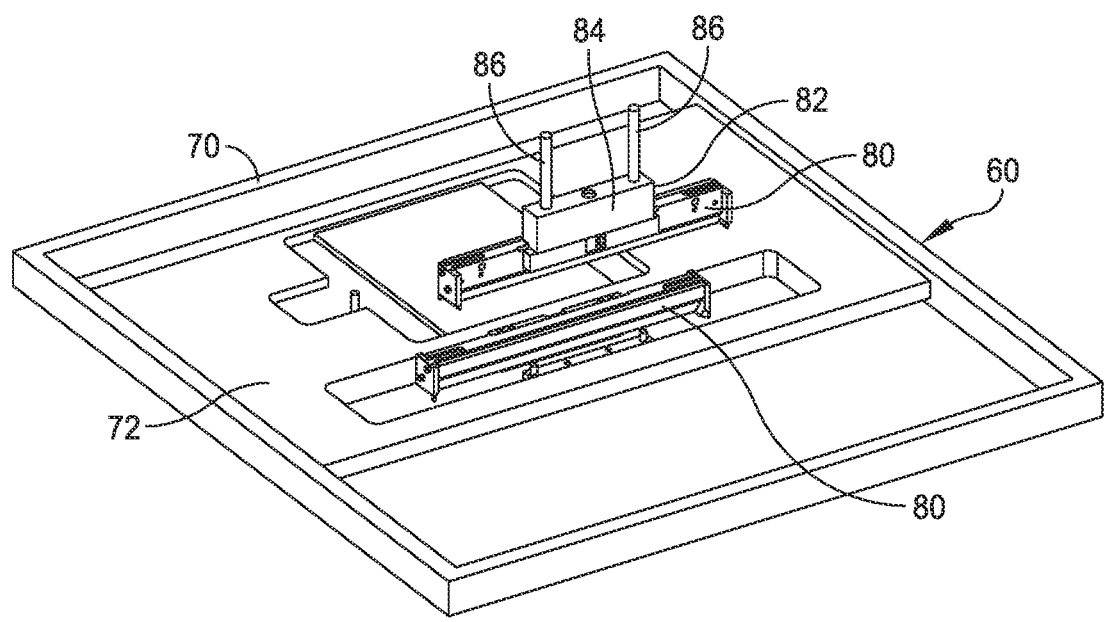
FIG. 6 is a perspective view of a tooling tray of another embodiment of the disclosure.

Referring to FIG. 6, the print head assembly 20 of the stencil printer 10 includes an end effector 82, which can be configured to pick up and release items from the tooling tray 60. As previously described, the print head assembly 20 is mounted on the print head assembly gantry 22, which moves the print head assembly in the y-axis direction under the control of the controller 14. The print head assembly 22 is configured to move in the z-axis direction as described above.

In one embodiment, the end effector 82 can be configured to pick up and release a squeegee blade assembly 80. The end effector 82 is configured to toolessly engage and disengage the squeegee blade assembly 80 to attach and remove the squeegee blade assembly from the print head assembly 20. As shown, the tooling tray 60 is configured with a spring-loaded locking mechanism to secure a squeegee blade holder of the squeegee blade assembly 80 to the end effector 82 of the print head assembly 20. A method of passively picking up and dropping off squeegee blade assemblies 80 without needing additional axes or actuators can be performed by the end effector 82.

Figure 7A:
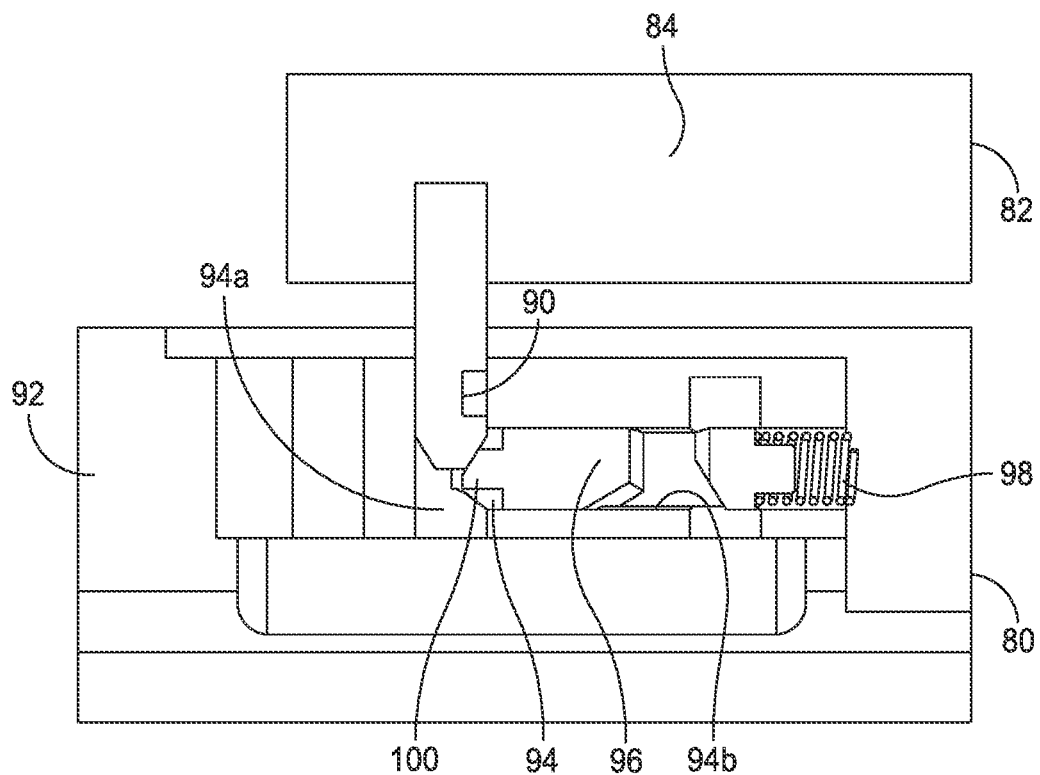
FIGS. 7A and 7B are cross-sectional views of a portion of an end effector of a print head assembly and a portion of a squeegee blade holder of a squeegee blade assembly in disengaged and engaged positions, respectively.
Figure 7B:
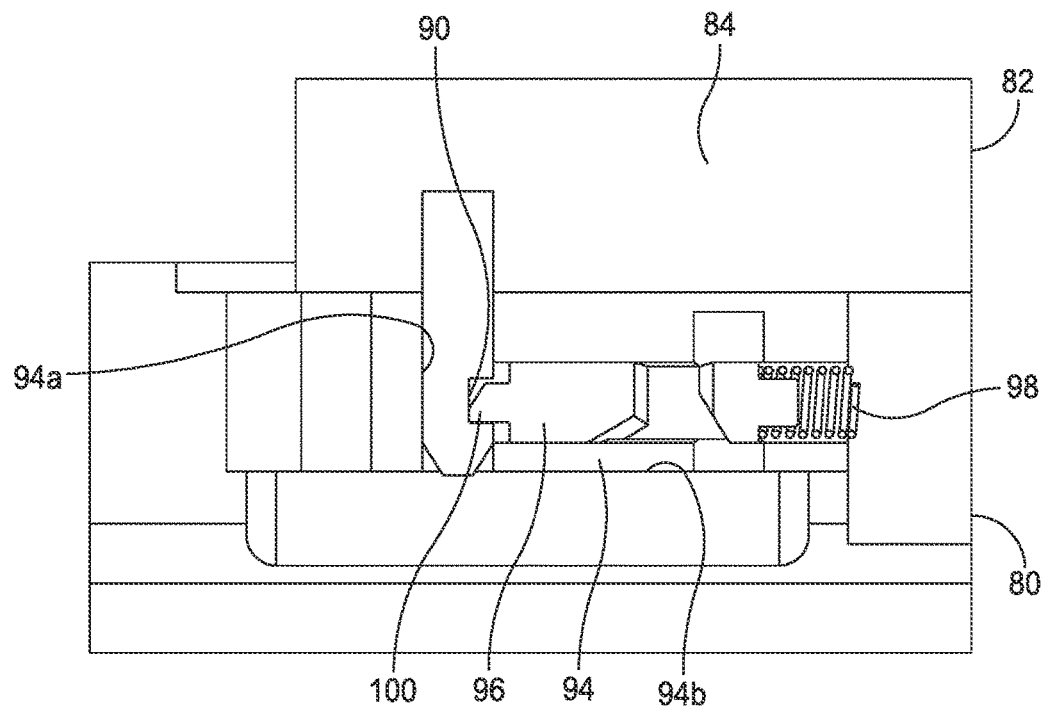
Figure 7C:
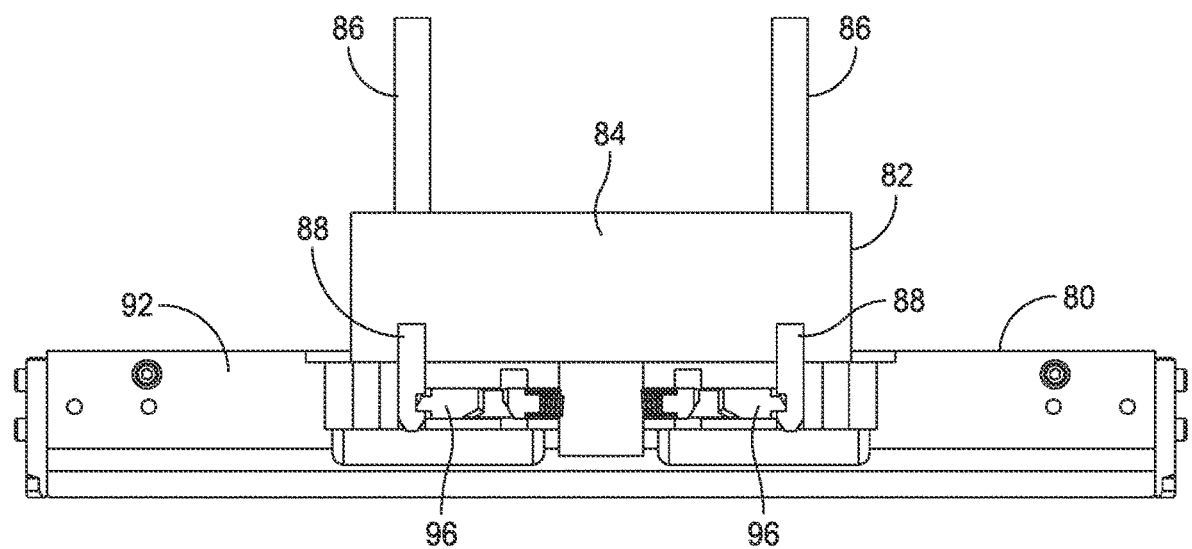
FIG. 7C is a cross-sectional view of the end effector and the squeegee blade holder in the engaged position.

Referring to FIGS. 7A-7C, the end effector 82 includes a rectangularly-shaped body 84 that is secured to the print head assembly 20 by a pair of connecting rods, each indicated at 86. The end effector 82 further includes a pair of downwardly extending pins (FIG. 7C), each indicated at 88, with each pin having a notch 90, the purpose of which will be described as the description of the mechanism proceeds. The squeegee blade assembly 80 includes a holder 92 having an L-shaped recess 94 formed therein. The recess 94 includes a vertical portion 94a and a horizontal portion 94b. The mechanism includes a spring-loaded pin 96 that is housed within the horizontal portion 94b of the recess 94, which is biased toward the vertical portion 94a of the recess by a spring 98.

FIGS. 7A and 7B illustrate the pin 88 of the end effector 82 entering the vertical portion 94a of the recess 94. As the pin 88 enters the vertical portion 94a of the recess 94, a sloped portion of the pin engages a corresponding sloped portion of the spring-loaded pin 96. The downward movement of the pin 88 causes the spring-loaded pin 96 to move against the bias of the spring 98 until the notch 90 of the pin receives an engaging element 100 of the spring-loaded pin to engage and secure the holder 92 of the squeegee blade assembly 80 to the end effector 82. FIG. 7C illustrates both pins 88 being secured by their respective spring-loaded pins 96 to secure the holder 92 of the squeegee blade assembly 80. In this position, the end effector 82 secures the squeegee blade assembly 80 in which the squeegee blade assembly can be employed to perform a stencil print operation.

FIGS. 8A and 8B illustrate the pin 88 of the end effector 82 being retracted from the vertical portion 94a of the recess 94. An upwardly projecting element 102 is provided on the tooling tray 60 to move the spring-loaded pin 96 from the engaged position illustrated in FIGS. 7B and 7C to the disengaged position illustrated in FIG. 7A. Referring to FIG. 8A, a sloped portion of the element 102 engages a corresponding sloped portion formed on the spring-loaded pin 96. The downward movement of the end effector 82 toward the element 102 causes the spring-loaded pin 96 to move against the bias of the spring 98 until the engaging element 100 of the spring-loaded pin is removed from the notch 90 of the pin 88 to release the squeegee blade assembly 80 from the end effector 82, which is shown in FIG. 8B. The element 102 maintains the spring-loaded pin 96 in the disengaged position thereby enabling the release of the holder 92 of the squeegee blade assembly 80.

In some embodiments, the end effector 82 can employ magnets to engage magnetic material associated with the squeegee blade assembly 80 to secure and release the squeegee blade assembly to the print head assembly 20.

Figure 9B:
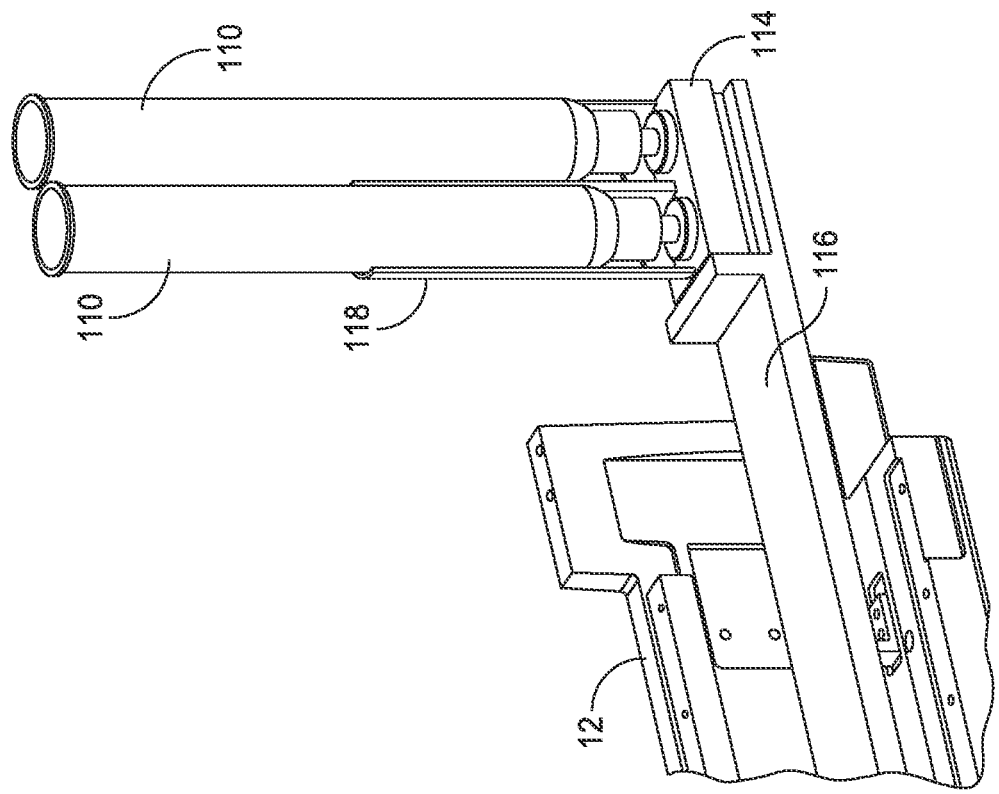
FIGS. 9A and 9B are perspective views of a magazine configured to support paste cartridges in retracted and extended positions, respectively.
Figure 9A:
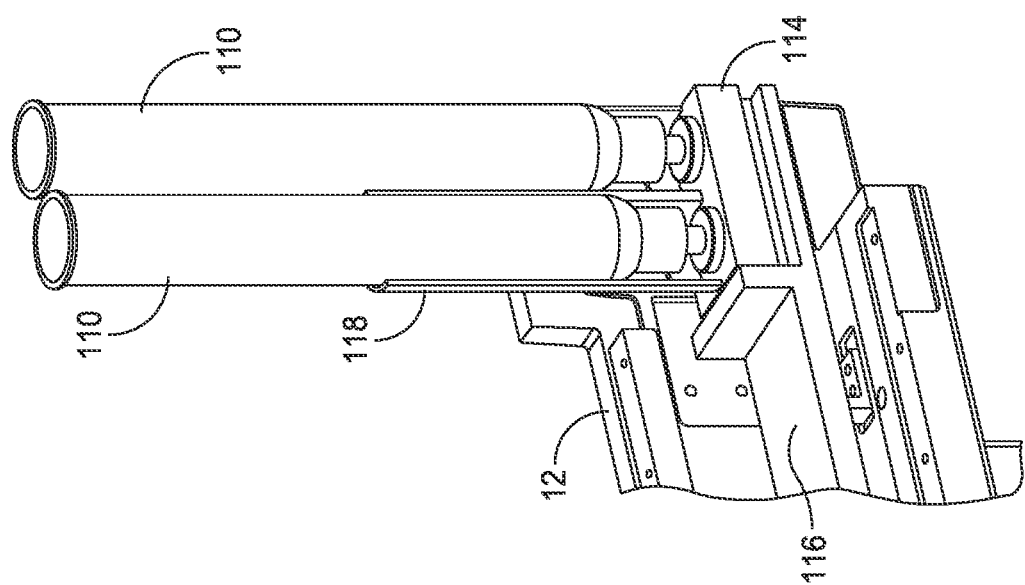

Referring back to FIG. 4, the movable cart 40 includes replacement paste cartridges, each indicated at 110. As shown, the paste cartridges 110 are supported on a paste cartridge staging area of the movable cart 40, otherwise referred to as an "on-deck-circle," which permits the stencil printer 10 to be continuously fed solder paste for uninterrupted operation. Referring to FIGS. 9A and 9B, the frame 12 of the stencil printer 10 includes a block 114 having recesses configured to support the paste cartridges 110 in an upright, vertical positions when receiving paste cartridges from the movable cart 40. The block 114 is secured to a movable support arm 116, which is coupled to the frame 12 of the stencil printer 10 and configured to move from a retracted position to an extended position. Each paste cartridge 110 is supported by a cylindrical half-wall 118 to provide lateral support to the paste cartridge to assist in maintaining the paste cartridge in a vertical position. The block 114 shown in FIGS. 9A and 9B is configured to support two paste cartridges 110, although the block may be configured to support any number of paste cartridges.

FIG. 9A illustrates the block 114 and the movable support arm 116 in the retracted position where the stencil printer 10 stores the paste cartridges 110. FIG. 9B illustrates the block 114 and the movable support arm 116 in the extended position in which paste cartridges 110 can be transferred from the movable cart 40 to the block. Any suitable mechanism can be provided to move the movable support arm 116, such as a ball screw drive assembly.

In some embodiments, the paste cartridges 110 can be hand fed manually onto the block 114 of the stencil printer 10 without the movable cart.

Figure 10:
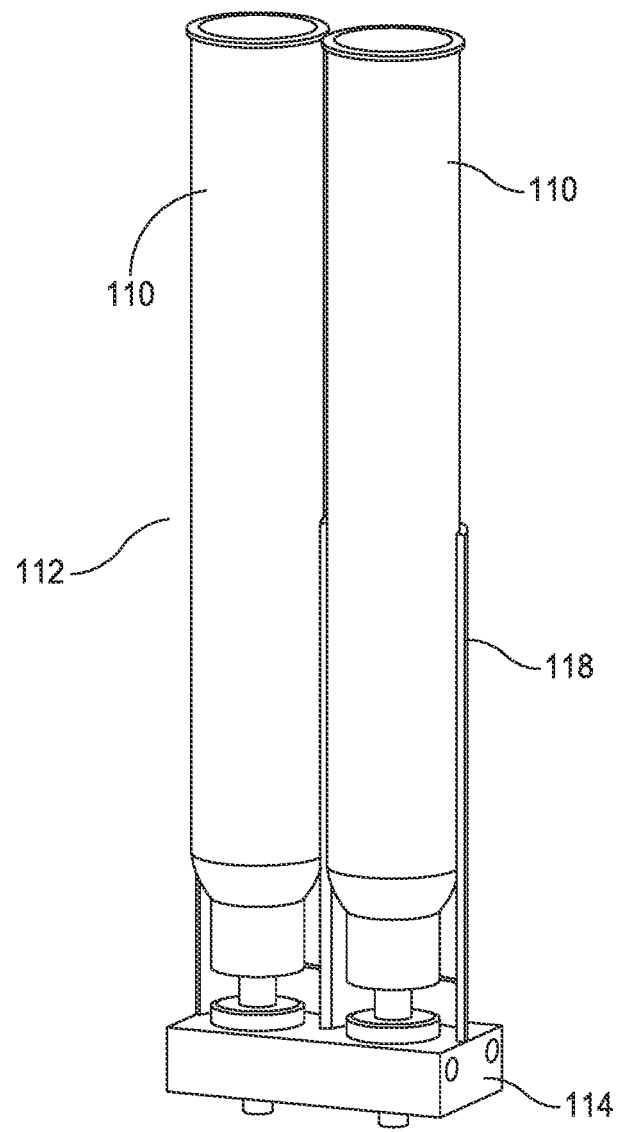
FIG. 10 is a perspective view of the paste cartridges.

Referring to FIG. 10, multiple paste cartridges 110 can be provided in a magazine 112 of "N" paste cartridges that permits operation of the stencil printer 10, including paste change-over(s), even when the movable cart 40 is not present. The number of paste cartridges 110 provided by the magazine 112 can be determined by the logistic needs of the stencil printer 10 and the particular application.

Figure 11:
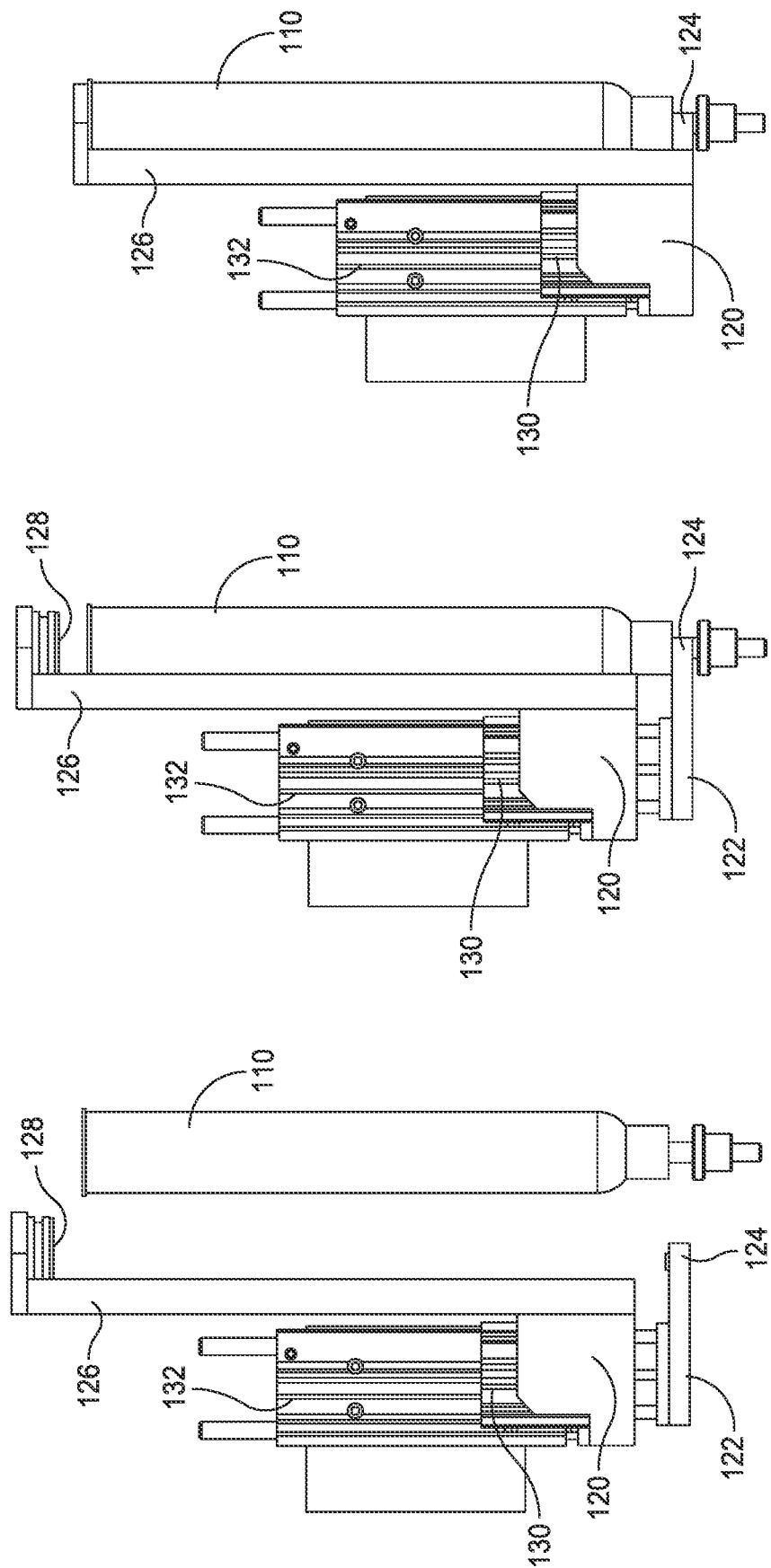
FIGS. 11A-11C are sequential views illustrating the installation of a paste cartridge on the print head assembly.

Referring to FIGS. 11A-11C, the process of installing the paste cartridge 110 on the print head assembly 20 is sequentially illustrated. The print head assembly 20 includes a paste cartridge mechanism including a support bracket 120 that is configured to receive, seat, seal and pressurize the paste cartridge 110 to the print head assembly 20. As shown, the support bracket 120 includes a base 122 having a receiving feature 124 designed to receive a bottom portion of the paste cartridge 110. In the shown example, the receiving feature 124 includes two spaced-apart prongs that are sized to surround a narrow cylindrical portion of the paste cartridge 110. The narrow cylindrical portion is disposed between two wider cylindrical portions to capture the prongs in between. The print head assembly 20 is configured to move to the paste cartridge 110 to secure the paste cartridge to the support bracket 120 of the paste cartridge mechanism by operating the print head assembly gantry 22.

The support bracket 120 of the paste cartridge mechanism further includes an upright member 126 that is configured to secure, seal and pressurize an upper portion of the paste cartridge 110. The upright member 126 includes a sealing portion 128 that is designed to seal the upper portion of the paste cartridge 110. Once the paste cartridge 110 is seated in the receiving feature 124 of the base 122, the base is configured to move upwardly in the manner shown between FIGS. 11B and 11C to seal a pneumatic pressure connection of the paste cartridge 110 with the sealing portion 128. Once pressurized, the paste cartridge 110 is ready to perform a dispensing operation. Any suitable mechanism can be employed to move the base 122 in an upward direction and in a downward direction to engage and disengage the paste cartridge 110 to and from the sealing portion 128, respectively. For example, a pneumatic assembly 130 can be provided to move the base 122. Another pneumatic cylinder 132 can be employed to lower the entire cylinder assembly during a dispensing operation. In one embodiment, the pneumatic cylinder 132 powers the up-and-down movement of the print head assembly 20 in the z-axis direction. After the paste cartridge 110 is lifted to seal against the sealing portion 128, the paste cartridge can be pressurized when required to dispense solder paste. The connection for this assembly is through the upright member 126 and the sealing portion 128.

Figure 12:
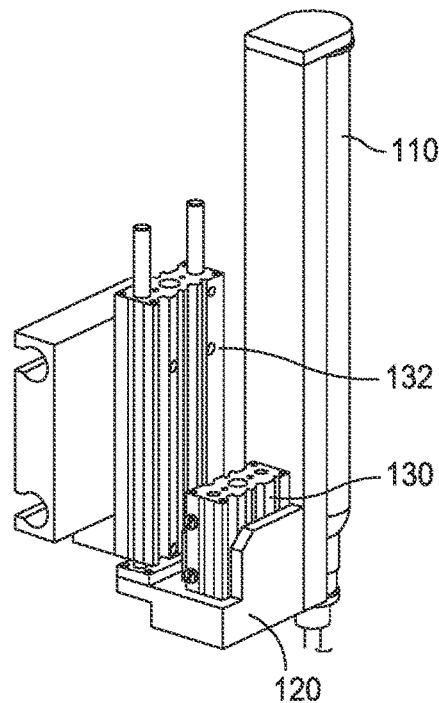
FIG. 12 is a perspective view of the paste cartridge provided in a paste cartridge mechanism.

FIG. 12 illustrates a paste cartridge 110 secured and sealed by the paste cartridge mechanism. Thus, the paste cartridge mechanism is capable of seating and sealing the paste cartridge 110. The paste cartridge mechanism can be configured to accept different sized paste cartridges or paste jars.

In some embodiments, each paste cartridge 110 includes a one-dimensional barcode label that wraps all the way around the paste cartridge, thereby permitting the reading of the barcode from any orientation relative to the tube.

Figure 13A:
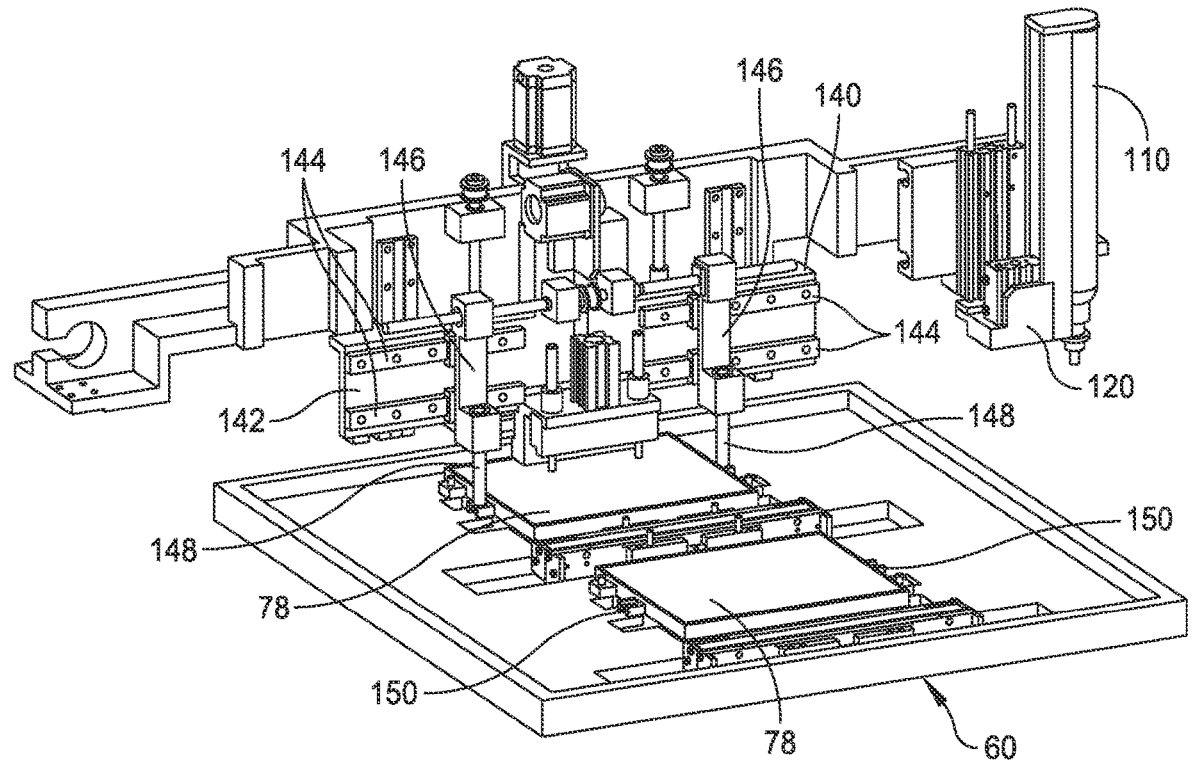
FIGS. 13A-13C are perspective views of the print head assembly configured to remove tooling from the tooling tray.
Figure 13B:
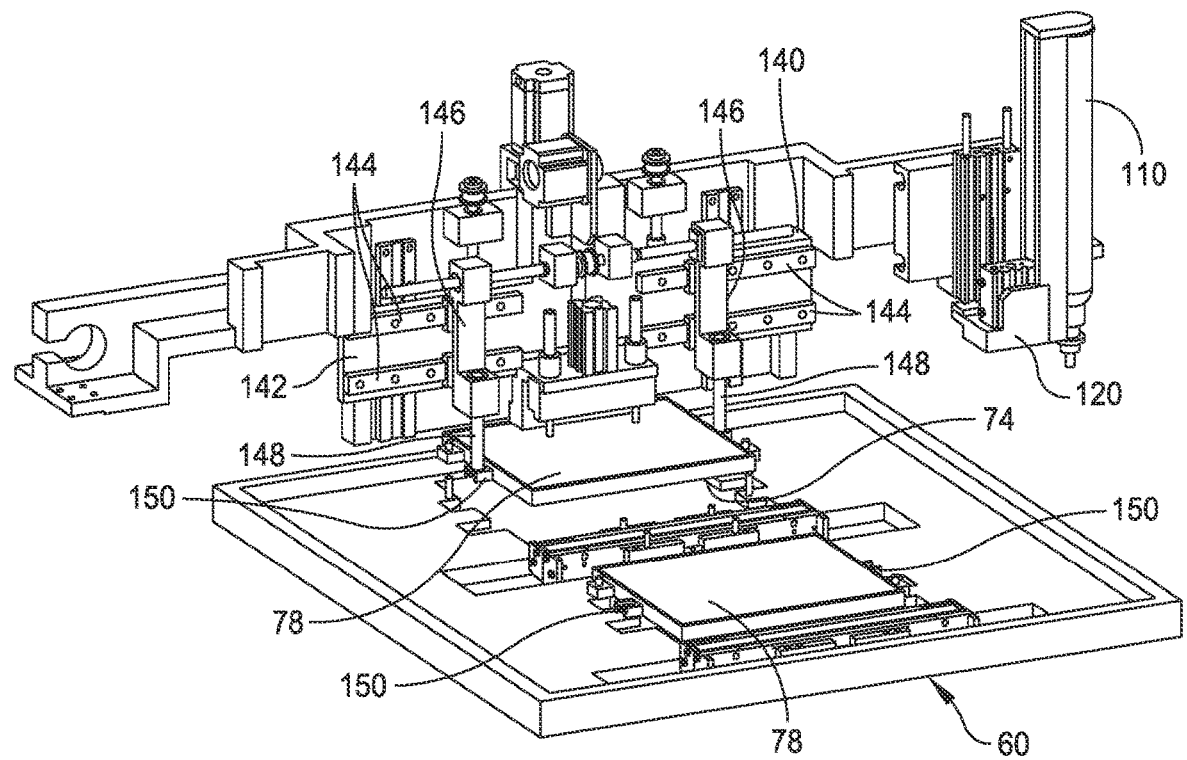
Figure 13C:
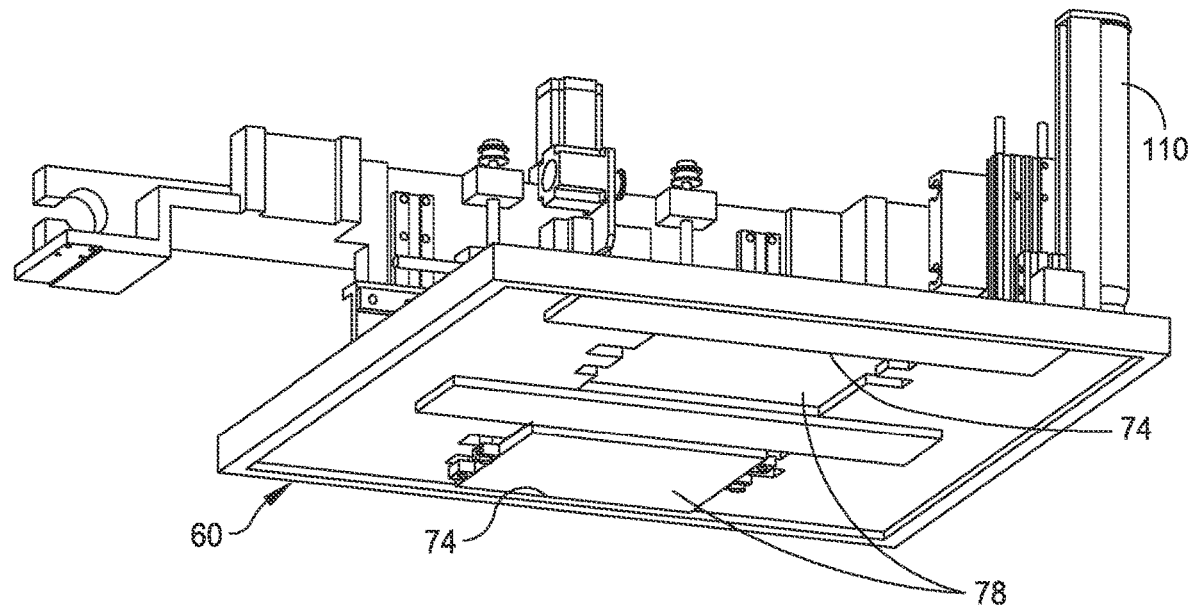

Referring to FIGS. 13A-13C, a support tooling movement mechanism is generally indicated at 140, which is configured to move the support tooling 78 from the tooling tray 60 to the stencil printer 10. As shown, the support tooling movement mechanism 140 includes a plate 142 mounted on the print head assembly 20. The plate 142 has four linear bearings, each indicated at 144, with a first set of linear bearings being positioned one above the other on one side of the plate and a second set of linear bearings being positioned one above the other on the other side of the plate. Each set of linear bearings 144 has a tooling member 146 configured to move laterally on the linear bearings. Any suitable mechanism can be employed to move the tooling member 146. For example, a ball screw drive assembly can be provided to move the tooling member 146 along the linear bearings. In one embodiment, the mechanism can be powered by the drive assembly that powers the up-and-down movement of the print head assembly 20 in the z-axis direction. Each tooling member 146 includes a downwardly extending pin 148 having a head configured to be received within a receiving feature 150 associated with the support tooling 78.

FIG. 13A illustrates the pins 148 of the tooling members 146 being received in respective mating features 150 of the support tooling 78. The tooling members 146 can be extended to a width wider than the support tooling 78, and moved toward one another to capture the support tooling 78 between the pins via the receiving features 150. The tooling tray 60 can include recesses formed therein that are located adjacent to the support tooling 78 to enable the pins 148 to be placed laterally adjacent to the receiving features 150 of the support tooling 78. FIG. 13B illustrates the print head assembly 20 being raised in a z-axis direction to pick up the support tooling 78. The mechanism used to pick up and drop off the support tooling 78 can be configured to engage and secure the support tooling, can include magnets to facilitate attachment and detachment of the support tooling from the tooling members. As shown, an opening, e.g., cut out 74, is provided in the tooling tray 60 to facilitate access to the support tooling in the stencil printer 10 from the print head assembly 20 while the tooling tray is in the stencil printer.

The arrangement is such that the movable cart 40 is configured to support a predetermined number of support tooling 78 used to support a printed circuit board 29 in a print position. The movable cart 40 and the stencil printer 10 operate with one another to identify the support tooling 78, store the support tooling, transport the support tooling to and from the stencil printer, inspect the support tooling, and interface with the stencil printer. The movable cart 40 and the stencil printer 10 also operate with one another to remove used parts, such as support tooling 78, from the stencil printer.

In some embodiments, multiplexing motion axes in the movable cart 40 can minimize cost and complexity of the drive system. The drives may reside in either the movable cart 40 or the stencil printer 10.

In some embodiments, the print head assembly 20 is capable of picking up and placing support tooling 78. The same print head assembly 20 is capable of picking up and dropping off squeegee blade assemblies 80.

In some embodiments, the mechanisms used to manage support tooling or plates 78, squeegee blade assemblies 80 and paste cartridges 110 can be provided on other gantries, instead of the print head assembly gantry 22, such as the imaging system gantry 32 or the stencil wiper assembly gantry.

The movable cart 40 can be configured with an interface, which is designed to dock within a docking station provided on the stencil printer 10. In one embodiment, the interface of the movable cart is configured to dock within the docking station of the stencil printer 10, both from a mechanic interface and an electronics communication interface. In a particular embodiment, the movable cart can be configured with a unique mechanical interface that mates with a unique mechanical interface of the stencil printer 10. The unique mechanical interfaces can include geometric features. In another embodiment, the movable cart can be configured with pins that are received within guides associated with the stencil printer 10 to register the movable cart with the stencil printer prior to fully docking the movable cart. The pins and guides can be reversed, with the pins provided on the stencil printer 10 and the guides provided in the movable cart. Other types of guides can be used, such as electrical/magnetic guides, vision guides, sensors, latches, etc. The movable cart, when docked within the docking station of the stencil printer 10, can physically engage the stencil printer or be spaced from the stencil printer.

In some embodiments, movable cart can be configured to clean squeegee blades by cleaning or otherwise removing used paste from the squeegee blades.

In some embodiments, the movable cart can be configured to change used squeegee blades by unclamping squeegee blades from the print head 20 and positioning the used squeegee blades on an open shelf of the movable cart. New squeegee blades are taken from the movable cart and mounted on the print head 20 of the stencil printer 10.

In some embodiments, the movable cart includes a controller that is adapted to control the operation of the movable cart based on operational parameters obtained by the controller. The controller can be configured to communicate with the controller 14 of the stencil printer 10 and/or a controller associated with the production line. In one embodiment having multiple movable carts, the controller may embody a plurality of controllers provided in each movable cart that communicates with one another over a controller area network (CAN) Bus or other type of network. In other embodiments, a master controller may be provided to control the operation of the controllers of the movable carts 80. Each movable cart may be provided with a display, which is operably coupled to the controller. The display is adapted to display the operational parameters of the movable cart, such as, but not limited to, the number of clean and used stencils, the number of full and spent/used paste cartridges, the number of new and used squeegee blades, and/or the number of new and used tooling. Suitable monitors may be provided to acquire such information. Alternatively, or in addition to the foregoing embodiment, the operational parameters may be displayed on the display 16 provided within the stencil printer 10 and/or a display associated with the production line.

In other embodiments, the movable cart may be controlled by the controller 14 of the stencil printer 10 and/or a controller associated with the production line. The controller can be a controller dedicated to one or more movable carts.

In some embodiments, material identification for items on the movable cart can include a device to manipulate the item and a scanner to scan and identify the item. For example, for paste cartridges, the movable cart can be configured to include a pinch wheel to rotate the paste cartridge to align a code or predetermined identification mark provided on the paste cartridge with scanner provided on the movable cart. The system is configured to tie material identification associated with the paste cartridge to a recipe, production time, etc., for the stencil printer 10. In one embodiment, a barcode to identify the items can be implemented. For example, the barcode can include a 1D scanner for UPC codes, a 2D scanner for QRC codes, a printed label applied on the item or a laser etched label etched on the item. In another embodiment, an RFID system to identify the items can be implemented. For example, the RFID system can include an RFID tag applied to the item and an RFID reader associated with the movable cart 40 or the stencil printer 10. With an RFID system, line-of-site between the reader and the item is not required. Moreover, scanning is not required to identify all items within the movable cart. In another embodiment, an imaging or vision system to identify the items can be implemented. The vision system could be an imaging system similar to the imaging system 30 associated with the stencil printer 10, and can be associated on the stencil printer, off the stencil printer or on the movable cart.

In some embodiments, a database is provided to keep track of items stocked on the movable cart. In one embodiment, the database may include an open application (App) architecture and be configured to push data to the stencil printer 10. The movable cart 40 can be configured to communication with the stencil printer 10 to push/pull data to stencil printer and/or the production line or configured to communicate with the production line directly. The database can include job information or material information. The database further can communicate with a manufacturing execution system (MES) associated with the production line, the stencil printer 10, or both. The MES system can be configured to know which materials are required for a production run. The movable cart can be configured to communicate with the MES system to adjust delivery of items to the stencil printer 10.

The database further can be configured to retrieve information about items based on identification, e.g., a barcode number. In one embodiment, a central management system can be provided in which the stencil printer 10 and/or the movable cart 40 is programmed to accept material coming from movable cart. The movable cart 40 is programmed to update the database to identify the materials on the movable cart, load information into the database associated with the movable cart and/or the stencil printer 10 from a network, which is tied back to the MES system.

The database further can be configured to store additional information, such as usage and consumption. The database can be configured to store information locally or remotely, and can be configured to store data associated with one or more production runs. For example, the database can be configured to obtain and store data including but not limited to traceability of stencils, paste cartridges, squeegee blades and tooling, paste usage, cycles, etc.

The database can be configured to share prediction data when replacement/replenishment is needed. For example, with respect to storing information related to paste cartridges, the database can be configured to perform one or more of the following: store information on when paste cartridges need replenishment; perform a certain function if a paste cartridge is low on paste; trigger an alarm and/or a report that the paste cartridge is low; signal to an inventory control system associated with the stencil printer 10 and/or the production line; perform analytics on consumable usage based on operating parameters and actual use and upstream/downstream equipment activity; predict changeout or maintenance (on the stencil printer and/or on the movable cart 40); and correlate over multiple sites to predict when to switch out paste cartridges. The database can be configured to share prediction data for other changeable/consumable items, such as for the stencils, paste cartridges, squeegee blades and tooling.

The database can be configured to store data associated with lot traceability. In addition, RFID or mechanical keying of a board or a stencil frame of the stencil is provided to ensure correct alignment/orientation/direction/front-back/top-bottom when these items are inserted into the stencil printer 10. This information can be used to verify correct orientation and/or fit before the items are transported from the warehouse and/or before the items are installed in the stencil printer 10. A low-cost reader can perform this function.

In some embodiments, the movable cart can be configured to store materials. The movable cart can be configured to be flexible to accommodate where the materials come from and where the materials go to. In addition, the movable cart can be configured to identify where a particular material is located on the movable cart. In certain embodiments, the location, whether by auto delivery or manual delivery, is remote, local, on the movable cart, and/or on the stencil printer 10. As mentioned above, the movable cart can be configured to control environmental parameters. For example, the movable cart can be configured to control temperature for paste contained within paste cartridges by chilling stored paste cartridges, heating paste cartridges ready for use, and chilling paste cartridges that have been used, but still retain paste. The movable cart further can be configured to predict when to start heating/chilling paste cartridges based on upcoming production, track time for shelf life, and individually control each paste cartridge to proper temperature and at correct time. In other embodiments, the movable cart can include a cartridge shooter to move paste cartridges. The movable cart further can be configured to control humidity to avoid condensate. The movable cart further can be configured to operate in a clean environment, e.g., a standard mechanical interface (SMIF) environment.

In some embodiments, the movable cart can be configured to perform inventory control. Specifically, the movable cart can be configured to identify where material is located, how much material is used, how the material is used, when the material is used, tie the material and information about the material to a customer inventory control system, and track material type consumed per board or lots of boards.

In some embodiments, the movable cart can be configured to organize items stored on the movable cart. As mentioned above, in one embodiment, one movable cart can be provided to store, transport and deliver multiple resources, including but not limited to stencils, paste cartridges, squeegee blades and tooling. In another embodiment, the movable cart can be configured to store, transport and deliver a single resource or item to the stencil printer 10. For example, the movable cart can be configured to store multiple stencils. The movable cart can be configured to service multiple production lines. In another embodiment, the movable cart can be configured to service one stencil printer 10.

In some embodiments, the movable cart can be configured to transport items from the movable cart to the stencil printer 10 and from the stencil printer to the movable cart, and be able to account for elevation differences between the movable cart and the stencil printer. The transportation can be automated or manual. In one embodiment, movable cart can be moved by automatically guided vehicle (AVG) technology associated with the movable cart or remotely controlled. In another embodiment, the movable cart can be configured to move autonomously. In another embodiment, the movable cart can be configured to be moved manually. In yet another embodiment, the movable cart can be configured to move items stored on the movable cart automatically and/or manually. For example, the movable cart can be configured to move items automatically, and can provide for an interruption of a pre-planned activity in which the items are moved manually.

In some embodiments, timing associated with performing transportation functions of the movable cart can be programmed to account for shift change, e.g., a personnel shift, scheduled maintenance, on demand activities, e.g., a recipe change, and predictive events (just-in-time replacements). The timing can be programmed to meet multiple line balance control requirements, with one or more movable carts and to meet real-time on-demand material supply demands on the production line.

In some embodiments, the movable cart is configured to perform inspection. For example, the movable cart can inspect on cart and off cart items including stencils, paste cartridges, squeegee blades, and tooling. In one embodiment, a vision system associated with the movable cart can be configured to obtain images of the items. The vision system in conjunction with the controller, can be configured to inspect for cleanliness, damage, wear, and identification readability, e.g., is the barcode label worn, dirty or torn. The vision system can embody any type of 2D, 3D or color camera.

In some embodiments, the interface and the docking station can be configured with a clamping system to maintain the movable cart in place with respect to the stencil printer 10. For example, a magnetic clamping system can be employed.

In some embodiments, the stencil printer 10 can be configured with multiple docking stations, e.g., five docking stations. The docking station can be provided at a front of the stencil printer 10 or at a back of the stencil printer.

The movable cart and/or the stencil printer 10 can be configured to verify whether the movable cart can be docked and interface with the stencil printer. In one embodiment, verification can be provided to confirm that the movable cart is in position and ready to interface with the stencil printer 10. This verification process can further determine whether correct materials are on the movable cart and whether the movable cart material information can be received from MES system, or locally identified. If not correct, the movable cart 40 can be configured to activate an alarm and/or alert an operator if wrong or damaged materials are on the movable cart.

In some embodiments, the movable cart can be configured with actuation devices or actuators to move items onto and off of the movable cart once the movable cart is docked to the stencil printer 10. Embodiments of the actuators can be implemented on the movable cart, the stencil printer 10 or both. In another embodiment, the items can be manually loaded and unloaded from the movable cart.

In some embodiments, the movable cart can be configured to interface with a production line. With this embodiment, the operator of the production line can confirm the correct location and acknowledge receipt of the movable cart on the stencil printer 10.

In some embodiments, the movable cart can be configured to communicate with the stencil printer 10, the production line, and/or select machines within the production line via an open platform. Communication systems can include a wired system, a wireless system (through a common network, mesh, Bluetooth, Wi-Fi, Zigbee, WAN, Nodes, Li-Fi, etc.), a combination of wired and wireless systems, and infrared (IR) system.

In some embodiments, the movable cart can be configured with a dedicated power source. In one embodiment, the movable cart includes a battery configured to power automated components provided in the movable cart, e.g., mechanisms used to move stencils into and out of the movable cart, mechanisms used to move paste cartridges into and out of the movable cart, mechanisms used to move squeegee blades into and out of the movable cart, and mechanisms used to move tooling into and out of the movable cart. In other embodiments, the movable cart can be configured with an uninterruptible power supply. The power source can be configured to support actuation while "docked" (high-voltage from stencil printer when docked, otherwise low-voltage when undocked). The power source can be configured to recharge for autonomous operations, e.g., recharge a battery from power provided by the stencil printer 10.

In some embodiments, the movable cart can be configured to function with the stencil printer 10. For example, the movable cart can be configured to provide a handshaking function with the stencil printer 10 prior to a transfer of an item, e.g., "please give me stencil #1234." The movable cart and the stencil printer 10 can be configured with a communication protocol and/or a library reference on what is available to consume. The movable cart can be configured to determine whether the movable cart has correct items. The handshaking function can be configured to ensure the correct transfer of an item, e.g., "here's stencil #1234," and/or the subsequent transfer of an item, e.g., "I now have stencil #1234." In one embodiment, a mobile device can be configured to scan and identify items in the movable cart, and determine, for example, whether the items are ready for use, require cleaning, etc.

In some embodiments, the movable cart can be configured to address errors associated with handling and recovering items in the movable cart. For example, the movable cart can be configured to detect an incomplete action by one party, an incomplete transfer of an item, e.g., a stuck or jammed item, a dropped transfer, e.g., "I passed stencil #1234 to you, don't you have it?," and a manual intervention or override, e.g., "here, let me help you." In one embodiment, a controller associated with the movable cart can be configured to perform static discharge control, data recovery and/or security.

In some embodiments, the movable cart can be configured with a higher level of capability. In addition to indexing all the equipment to the correct height, the movable cart would need to pull in/push out all equipment for stencil printer gantries to attach.

In some embodiments, existing stencil printer gantries, rails and print head of the stencil printer 10 can be configured to shuttle items in and out.

In some embodiments, the print head 20 of the stencil printer 10 can be configured to lift and shuttle a support tooling.

In some embodiments, the movable cart can be configured with a paste cartridge indexer at a top of the movable cart to load/unload paste cartridges.

In some embodiments, the movable cart can be configured to communication with the stencil printer 10, the production line and a warehouse associated with the production line.

In some embodiments, the movable cart can be configured with an electrical/pneumatic interface.

In some embodiments, the movable cart can be configured to track consumables—new and used on the movable cart, e.g., solder paste cartridges, including location, temperature and other data.

In some embodiments, the movable cart can be configured to store and supply stencils for duration of a production run.

In some embodiments, the movable cart can be configured to verify and ensure that the squeegee blades are associated with a stencil to ensure compatibility of parts during a changeover.

In some embodiments, the squeegee blades can include disposable blades that are plastic molded blade.

In some embodiments, the movable cart can be configured to scan all consumables with a suitable scanning device, such as a barcode reader or RFID reader.

In some embodiments, the movable cart can be configured with an indexing mechanism to properly locate consumables.

In some embodiments, the movable cart can be configured with a bypass switch to disconnect the movable cart from the stencil printer 10 if the movable cart has an issue.

In some embodiments, the movable cart can be configured to be moved manually or by an automated guided vehicle (AGV).

In some embodiments, the movable cart can be configured to dock and interface with the stencil printer 10.

In some embodiments, the movable cart can be configured to service multiple stencil printers 10.

In some embodiments, the movable cart can be configured to be dedicated to one consumable item, e.g., stencils, or multiple consumable/changeover items.

In some embodiments, the movable cart can be configured to transport and present the consumables to be cleaned at a remote station.

In some embodiments, the movable cart can be configured to be refilled at a stockroom associated with a warehouse.

In some embodiments, the movable cart can be configured to be climate controlled, either actively or passively.

In some embodiments, the movable cart can be configured be controlled by an application (App) capable for smartphone integration.

As used herein, an "automated" or "fully automated" changeover describes the replacement or replenishment of an item without human intervention.

As used herein, a "partially automated" changeover describes the replacement or replenishment of an item with some or limited human intervention.

As used herein, "transport," "transporting," "transfer" or "transferring" describes moving an item from one position to another, either manually or with a machine.

As used herein, "install" or "installing" describes the process of placing an item in a position ready for use.

As mentioned above, the movable cart 80 and the robotic arm 140 can be employed to replace other items within the stencil printer 10. For example, the stencil wiper assembly 34 includes consumables, e.g., paper and solvent, which can be automatically replaced by the movable cart 80 and the robotic arm 140.

The concepts disclosed herein may be employed in other types of equipment used to fabricate electronic substrates, including dispensers, pick-and-place machines, reflow ovens, wave soldering machines, selective solder machines, inspection stations, and cleaning stations. For example, the concepts directed to replacing paste cartridges can be employed in dispensers used to dispense viscous material. In another example, the concepts directed to replacing tooling can be employed in dispensers and in pick-and-place machines used to mount electronic components onto electronic substrates. In another example, the concepts directed to replacing items can be employed in replacing solder within wave soldering and selective soldering machines and cleaning product within cleaning stations.

Paste Dispensing Transfer System and Method

In one embodiment, the stencil printer includes a paste dispensing transfer system configured to remove spent or used paste cartridges from the print head assembly and install new paste cartridges in the print head assembly. The paste dispensing transfer system can be configured to include a rotary indexing mechanism designed to receive used paste cartridges from the print head assembly of the stencil printer and deliver new paste cartridges to the print head assembly of the stencil printer. The rotary indexing mechanism can be located on a frame of the stencil printer. The paste dispensing transfer system further can be configured to include a paste cartridge mechanism having an end effector configured to deliver used paste cartridges to the rotary indexing mechanism and to receive new paste cartridges from the rotary indexing mechanism. The paste cartridge mechanism can be located on the print head assembly of the stencil printer.

In some embodiments, the paste cartridges can be hand fed manually onto the rotary indexing mechanism of the paste dispensing transfer system of the stencil printer. The number of paste cartridges stored in the rotary indexing mechanism of the paste dispensing transfer system can be determined by the logistic needs of the stencil printer and the particular application. The process of installing the paste cartridge on the print head assembly includes receiving, seating, sealing and pressurizing the paste cartridge to the print head assembly. The rotary indexing mechanism cooperates with the paste cartridge mechanism having the end effector to achieve this process.

In some embodiments, the paste dispensing transfer system is configured so that the paste cartridge mechanism interfaces with the rotary indexing mechanism. The paste cartridge mechanism is configured to include a support bracket, an actuator and an end effector configured to receive, seat, seal and pressurize the paste cartridge to the material dispenser assembly mounted on the print head assembly. The support bracket may include a base having a receiving feature designed to receive a bottom portion of the paste/material cartridge. The receiving feature may include two spaced-apart prongs that are sized to surround a narrow cylindrical portion of the nozzle of the paste cartridge, with the narrow cylindrical portion being disposed between two wider cylindrical portions to capture the prongs in between. The support bracket of the paste cartridge mechanism further may include an upright member having a sealing portion configured to secure and seal an upper portion of the paste/material cartridge and to deliver pressurized air to the paste cartridge to dispense solder paste or other dispensable materials without the need for user intervention or interaction.

Figure 14:
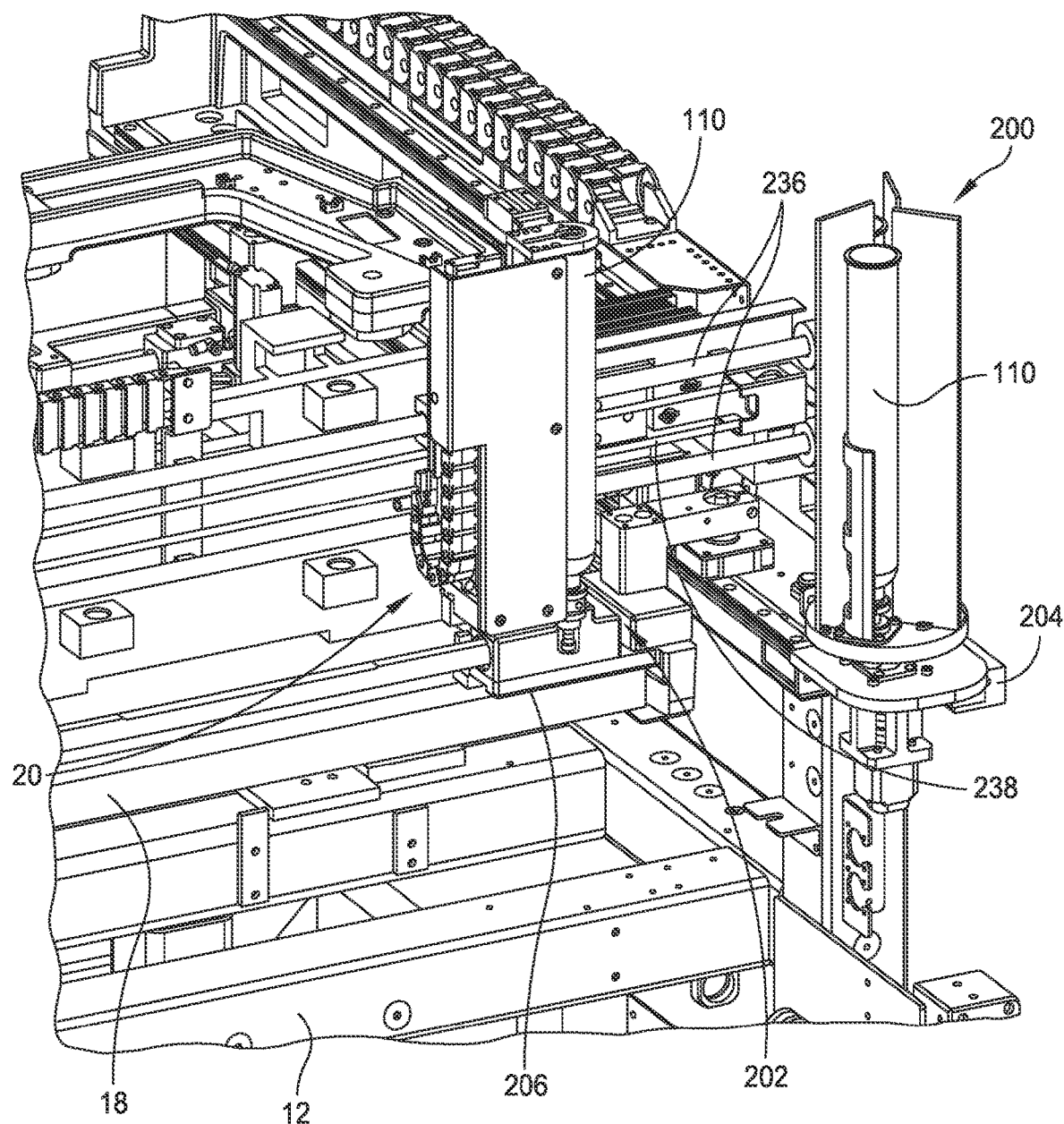
FIG. 14 is a perspective view of a paste dispensing transfer system of the embodiment of the present disclosure.

Referring to the drawings, and more particularly FIG. 14, a paste dispensing transfer system of an embodiment of the present disclosure includes a rotary indexing mechanism, generally indicated at 200, and a paste cartridge mechanism, generally indicated at 202. As shown, the rotary indexing mechanism 200 is secured to a support member 204 of the frame 12 positioned at a front of the stencil printer 10. In other embodiments, the rotary indexing mechanism 200 can be located at a rear of the stencil printer 10. The paste cartridge mechanism 200 is mounted on a support member 206 the print head assembly 20 and moves with the print head assembly by the print head assembly gantry 22. As shown in FIG. 14, the print head assembly 20 and the paste cartridge mechanism 202 can be moved in the y-axis direction by the print head assembly gantry 22 toward the front of the stencil printer 10 adjacent the rotary indexing mechanism 200. In this position, the paste cartridge mechanism 202 can transfer spent or used paste cartridges, such as paste cartridge 110, to the rotary indexing mechanism 200 and receive new paste cartridges from the rotary indexing mechanism.

Figure 15A:
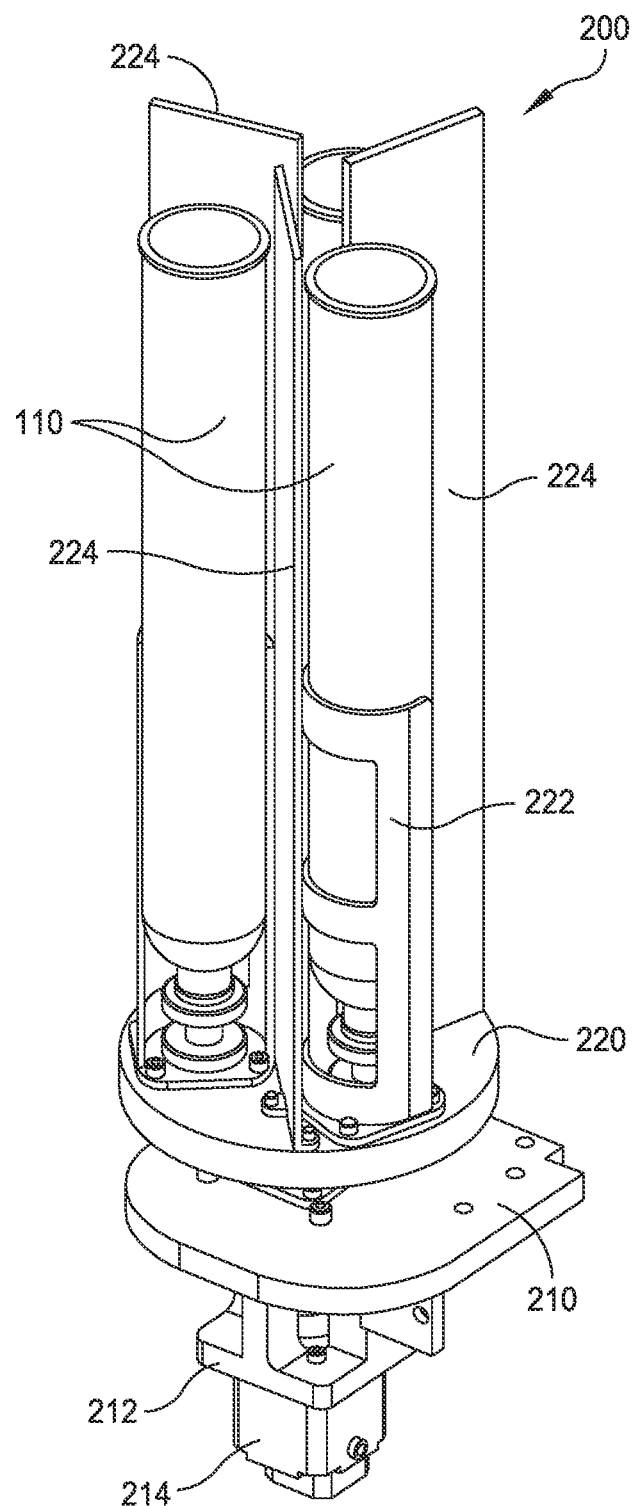
FIG. 15A is an enlarged perspective view of a rotary indexing mechanism of the paste dispensing transfer system.
Figure 15B:
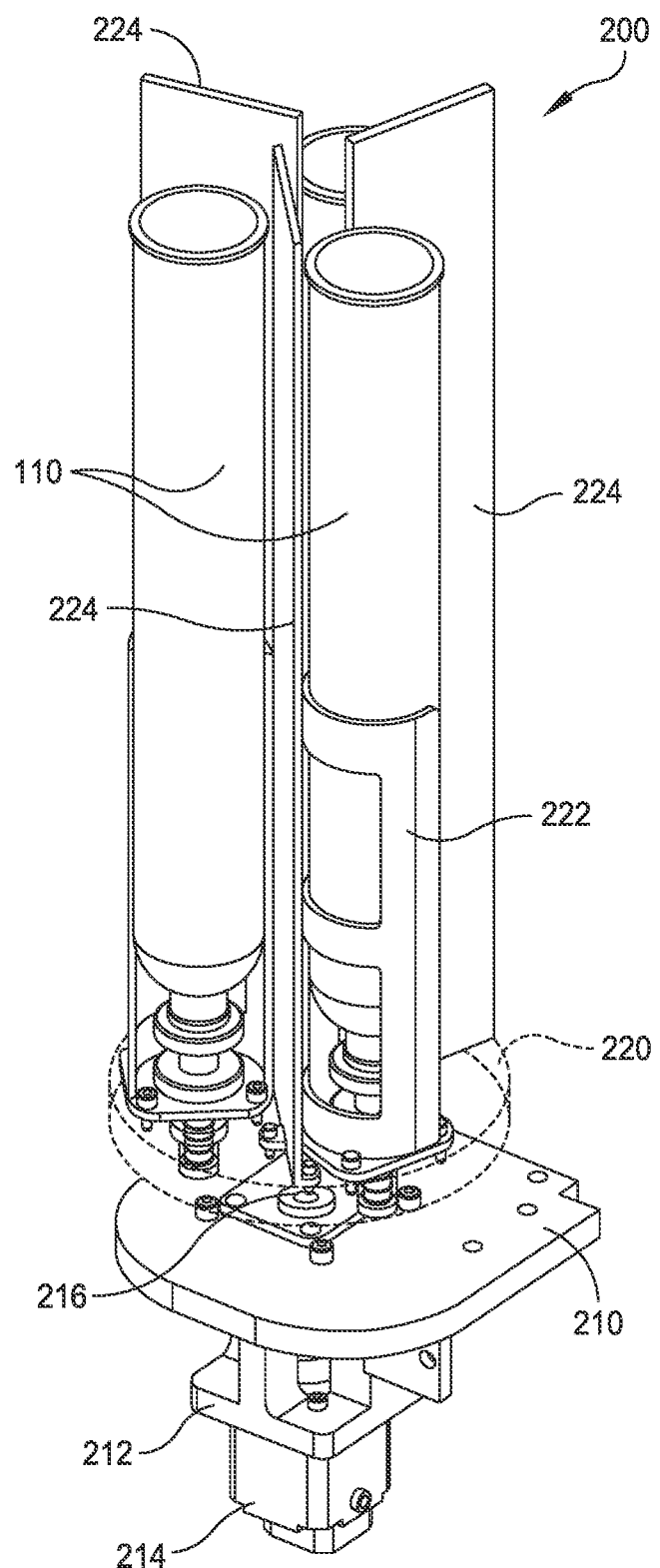
FIG. 15B is an enlarged perspective view of the rotary indexing mechanism of the paste dispensing transfer system showing details of the rotary indexing mechanism.

Referring to FIGS. 15A and 15B, the rotary indexing mechanism 200 includes a mounting bracket 210 configured to secure the rotary indexing mechanism to the support member 204 of the frame 12. A motor and bearing housing 212 is secured to a bottom of the mounting bracket 210 to secure a motor and gear box assembly 214, which is provided to drive the rotation of a shaft 216 of the rotary indexing mechanism 200. In one embodiment, the operation of the motor and gear box assembly 214 of the rotary indexing mechanism 200 is controlled by the controller 14 of the stencil printer 10.

The rotary indexing mechanism 200 further includes a carousel mount 220, which in the shown embodiment is a circular disk that is mounted on the shaft 216. Thus, the carousel mount 220 is configured to rotate, either clockwise or counterclockwise, by operation of the motor and gear box assembly 214. A paste cartridge tube holder 222 is mounted on a top surface of the carousel mount 220. In one embodiment, the tube holder 222 embodies a half-wall that is configured to provide lateral support to the paste cartridge 110 to assist in maintaining the paste cartridge in a vertical, upright position. The rotary indexing mechanism 200 further includes several dividers, each indicated at 224, which are provided to separate the paste cartridges 110 supported by the rotary indexing mechanism from each other. In the shown embodiment, there are three dividers 224; however, any number of dividers can be provided depending on the number of paste cartridges 110 to be supported by the rotary indexing mechanism 200.

The top surface of the carousel mount 220 of the rotary indexing mechanism 200 is configured to support a nozzle 111 of the paste cartridge 110 so that the paste cartridge is in the upright position. The rotary indexing mechanism 200 can be rotated to present an open receptacle defined between two adjacent dividers 224 to the paste cartridge mechanism 202 to receive a spent or used paste cartridge 110 from the paste cartridge mechanism. In this position, the paste cartridge mechanism 202 can transfer the used paste cartridge 110 to the open receptacle of the rotary indexing mechanism 200. The rotary indexing mechanism 200 further can be rotated to present a new paste cartridge 110 for transfer to the paste cartridge mechanism. In this position, the paste cartridge mechanism 202 can receive the new paste cartridge 110 and install the new paste cartridge for operation within the print head assembly 20.

Figure 16A:
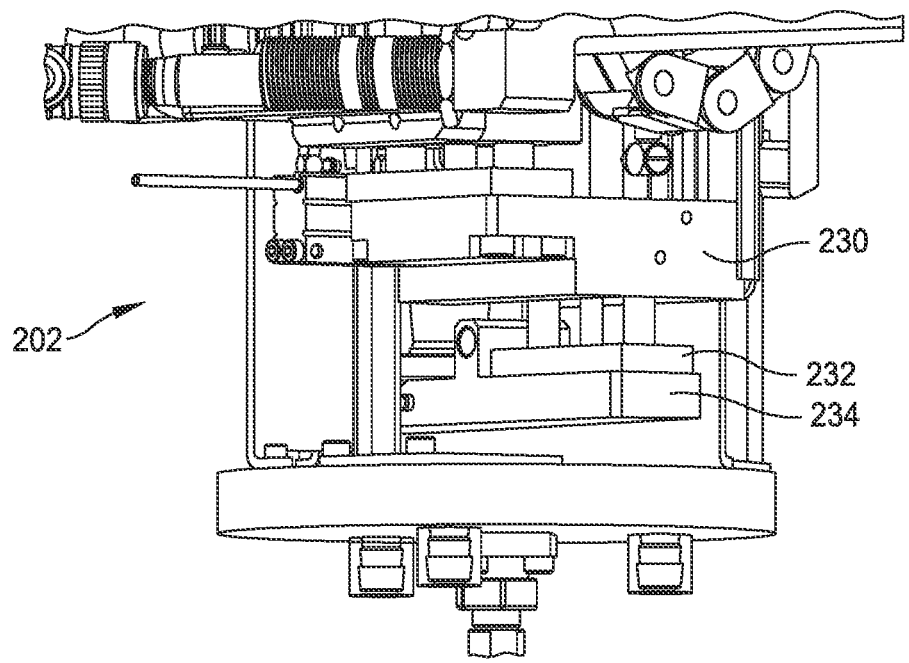
FIG. 16A is an enlarged perspective view of an end effector having a paste cartridge mechanism of the paste dispensing transfer system.
Figure 16B:
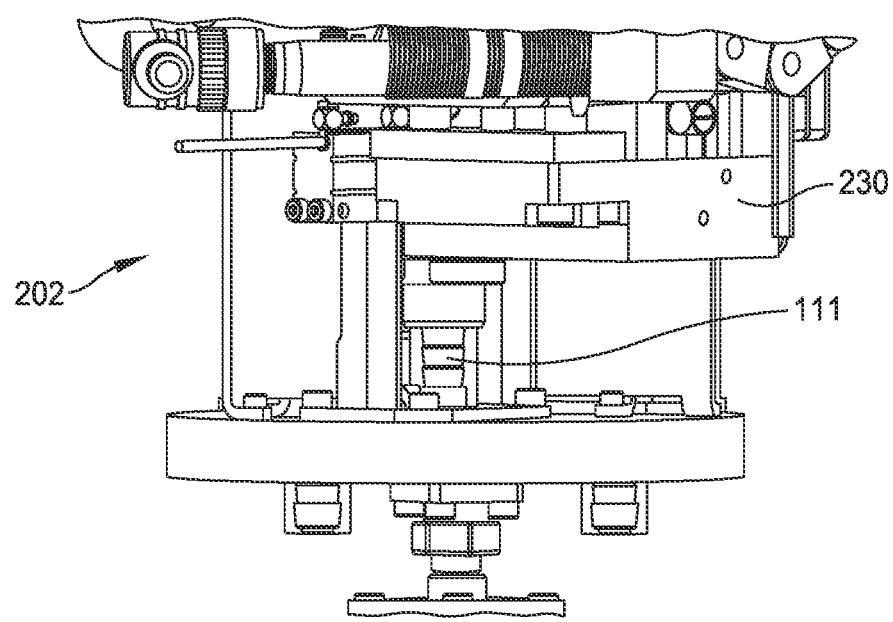
FIG. 16B is another enlarged perspective view of the end effector having the paste cartridge mechanism.

Referring to FIGS. 16A and 16B, the paste cartridge mechanism 202 includes a support bracket 230 mounted on the support member 206 of the print head assembly 20 and an actuator 232 secured to the support bracket. In one embodiment, the actuator 232 is a linear actuator configured to move in the z-axis direction, i.e., up and down. The support bracket 230 may include an end effector 234 having a base with a receiving feature designed to receive a bottom portion of the nozzle 111 of the paste cartridge 110. The end effector 234 is configured to selectively engage and secure the nozzle 111 of the paste cartridge 110 and maintain the paste cartridge in the vertical, upright position. The arrangement is such that the end effector 234 of the print cartridge mechanism 202 can be manipulated to engage and secure the nozzle 111 of the paste cartridge 110 to support the paste cartridge in the vertical, upright position and move the paste cartridge to an operational position within the print head assembly 20.

The actuator 232 of the paste cartridge mechanism 202 is secured to the support member 206 of the print head assembly 20 by the support bracket 230 and configured to move in the y-axis direction by motion provided by the print head assembly gantry 22. The support bracket 230 can be secured to the support member 206 of the print head assembly 20 by a linear bearing to enable the movement of the support bracket, actuator 232 and end effector 234 in the x-axis direction. In one embodiment, which is best shown in FIG. 14, the support bracket 230 is mounted to the support member 206 of the print head assembly 20 by two linear rod bearings, each indicated at 236, and driven by a timing belt 238 coupled to a motor. This enables the lateral movement of the end effector 234 to reach the rotary indexing mechanism 200. Other drives may be used, such as a motor and ball screw assembly to drive the movement of the support bracket 230 and thus the end effector 234. The print head assembly 20 is configured to move laterally along the x-axis direction to deposit solder paste (or another suitable assembly material) at a desired location a width of the stencil 18.

Figure 17A:
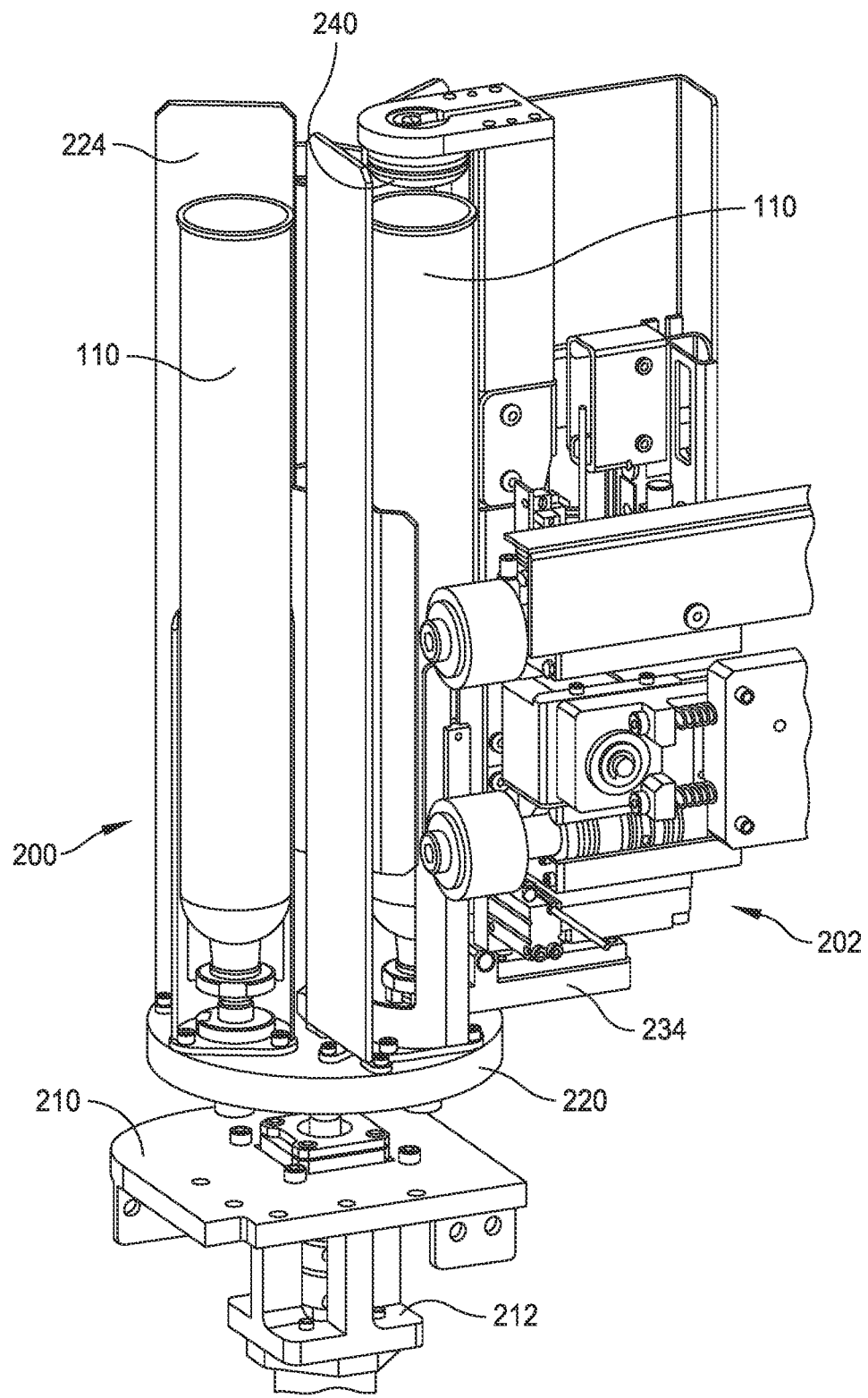
FIGS. 17A and 17B are perspective views showing the interaction of the rotary indexing mechanism and the end effector having the paste cartridge mechanism of the paste dispensing transfer system.
Figure 17B:
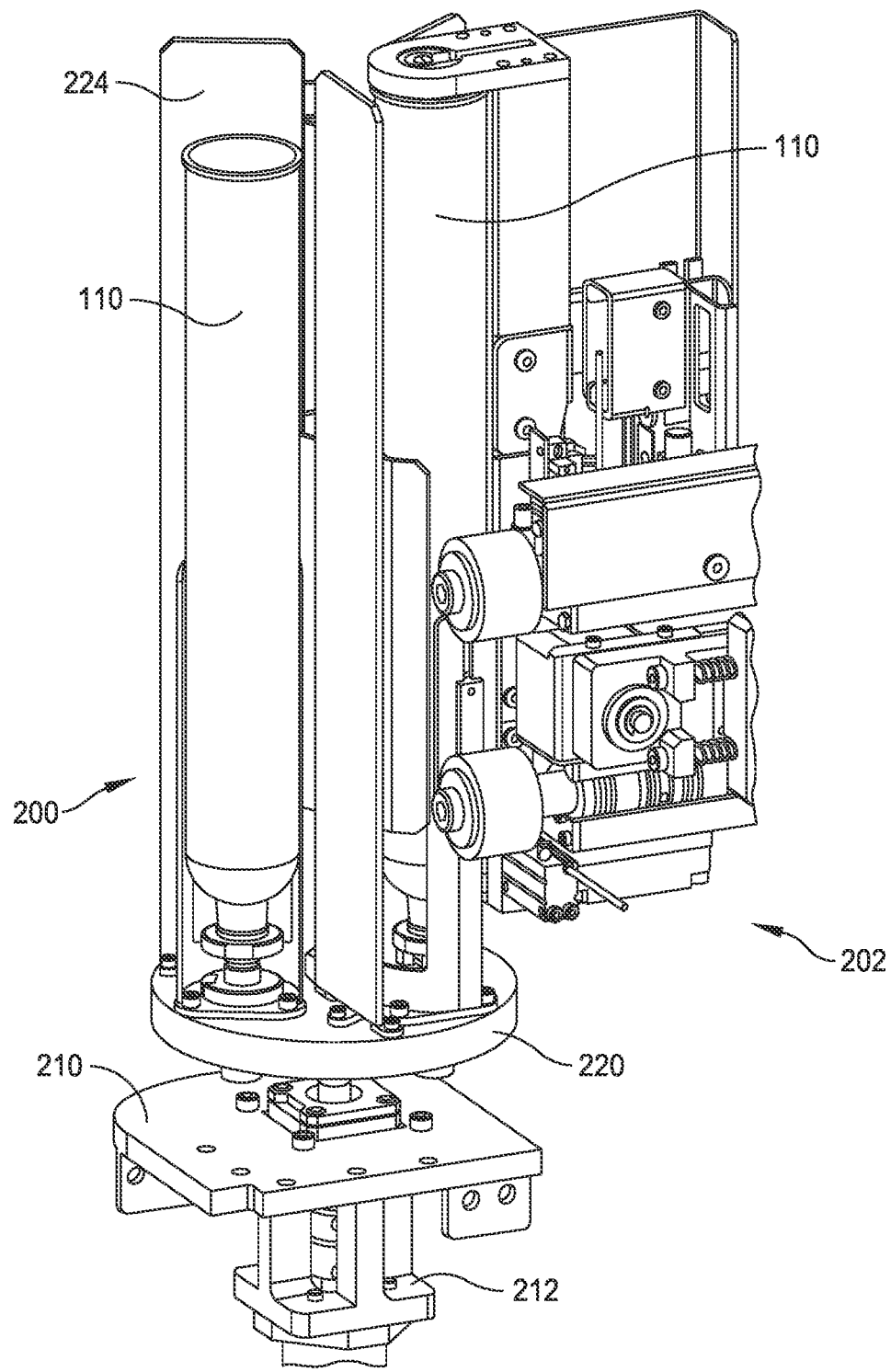

Referring to FIGS. 17A and 17B, the actuator 232 is configured to move the end effector 234 of the paste cartridge mechanism 202 in an up and down motion along the z-axis direction. The arrangement is such that the end effector 234 is moved laterally toward the nozzle 111 of the paste cartridge 110 positioned in the rotary indexing machine 200 to secure the nozzle of the paste cartridge. This arrangement is shown in FIG. 17A. Once secured by the end effector 234, the actuator 232 moves the paste cartridge 110 upwardly so that an open end of the paste cartridge is sealed by a paste cartridge sealing feature 240 of the print head assembly 20. After the paste cartridge 110 is lifted to seal against the sealing feature 240, the paste cartridge can be pressurized when required to dispense solder paste. After being sealed, the paste cartridge 110 can be moved away from the rotary indexing mechanism 200. In one embodiment, the operation of the actuator 232 of the paste cartridge mechanism 202 is controlled by the controller 14 of the stencil printer 10.

Figure 18:
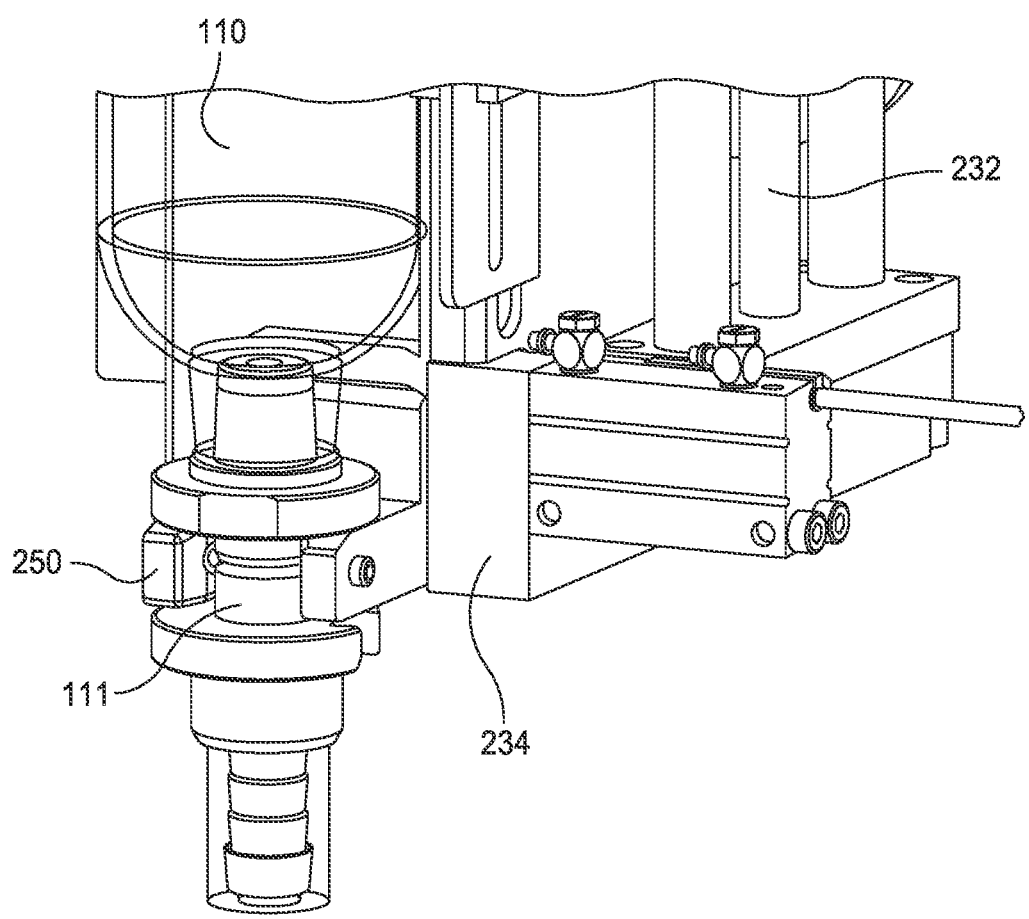
FIG. 18 is an enlarged perspective view of the end effector having the paste cartridge mechanism.

Referring to FIG. 18, in one embodiment, the end effector 234 includes a receiving feature 250 may include two spaced-apart prongs that are sized to surround a narrow cylindrical portion of the nozzle 111 of the paste cartridge 110, with the narrow cylindrical portion being disposed between two wider cylindrical portions to capture the prongs in between. The arrangement is such that the prongs of the receive feature 250 are captured between the two wider cylindrical portions of the nozzle 111 to enable the end effector 234 to support the paste cartridge 110 in the upright position. Other end effector structures can be used with complementary features of the nozzle to secure the nozzle 111 of the paste cartridge 110 to the end effector.

In some embodiments, the rotary indexing mechanism 200 and the paste cartridge mechanism 202 can be configured to accept different sized paste cartridges or paste jars.

In some embodiments, the paste cartridge 110 is configured to contain an assembly material, including but not limited to solder paste, conductive ink, or encapsulation material.

In some embodiments, each paste cartridge 110 includes a one-dimensional barcode label that wraps all the way around the paste cartridge, thereby permitting the reading of the barcode from any orientation relative to the tube.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A stencil printer for printing an assembly material on an electronic substrate, the stencil printer comprising:
a frame;
a stencil coupled to the frame, the stencil having apertures formed therein;
a support assembly coupled to the frame, the support assembly including tooling configured to support the electronic substrate in a print position beneath the stencil;
a print head assembly coupled to the frame in such a manner that the print head assembly is configured to traverse the stencil during print strokes, the print head assembly including a squeegee blade assembly and at least one paste cartridge to deposit assembly material on the stencil; and
a paste dispensing transfer system including
a paste cartridge mechanism coupled to the print head assembly, and
a rotary indexing mechanism coupled to the frame,
wherein the paste dispensing transfer system is configured to transfer a used paste cartridge from the print head assembly to the rotary indexing mechanism supported by the frame and to transfer a new paste cartridge from the rotary indexing mechanism to the print head assembly.

2. The stencil printer of claim 1, wherein the rotary indexing mechanism includes a carousel mount configured to rotate, a paste cartridge tube holder mounted on a top surface of the carousel mount, and several dividers provided to separate the paste cartridges supported by the rotary indexing mechanism from each other.

3. The stencil printer of claim 2, wherein the tube holder includes a half-wall that is configured to provide lateral support to a paste cartridge to maintain the paste cartridge in a vertical, upright position.

4. The stencil printer of claim 2, wherein the rotary indexing mechanism is configured to be rotated to present an open receptacle defined between two adjacent dividers to receive the used paste cartridge and to be rotated to present a new paste cartridge to transfer to print head assembly.

5. The stencil printer of claim 2, wherein the rotary indexing mechanism further includes a mounting bracket configured to secure the rotary indexing mechanism to a support member of the frame.

6. The stencil printer of claim 5, wherein the rotary indexing mechanism further includes a motor and bearing housing secured to a bottom of the mounting bracket to secure a motor and gear box assembly, and a shaft coupled to the motor bearing housing and the carousel mount to drive the rotation of the carousel mount.

7. The stencil printer of claim 2, wherein the paste cartridge mechanism includes a support bracket mounted on a support member of the print head assembly and an actuator secured to the support bracket to move the support bracket in a z-axis direction.

8. The stencil printer of claim 7, wherein the support bracket includes an end effector having a base with a receiving feature designed to receive a bottom portion of the nozzle of the paste cartridge, the end effector being configured to selectively engage and secure the nozzle of the paste cartridge and maintain the paste cartridge in the vertical, upright position.

9. The stencil printer of claim 8, wherein the support bracket is secured to the support member of the print head assembly by at least one linear bearing to enable the movement of the support bracket, actuator and end effector in the x-axis direction and is driven by a timing belt.

10. The stencil printer of claim 8, wherein the actuator is configured to move the paste cartridge upwardly so that an open end of the paste cartridge is sealed by a cartridge sealing feature of the print head assembly.

11. The stencil printer of claim 8, wherein the end effector includes a receiving feature having two spaced-apart prongs that are sized to surround a narrow cylindrical portion of the nozzle of the paste cartridge to enable the end effector to support the paste cartridge in the upright, vertical position.

12. A method of fully automating a changeover and/or a replacement process within a stencil printer, the method comprising:
   identifying a used paste cartridge scheduled for replacement within the stencil printer;
   transferring the used paste cartridge from a print head assembly with a paste cartridge mechanism to a rotary indexing mechanism;
   transferring a new paste cartridge from the rotary indexing mechanism to the paste cartridge mechanism; and
   installing the new paste cartridge within the print head assembly.

13. The method of claim 12, wherein transferring the used paste cartridge includes presenting an open receptacle of the rotary indexing mechanism and moving the used paste cartridge to the open receptacle.

14. The method of claim 12, wherein transferring a new paste cartridge includes presenting the new paste cartridge to the paste cartridge mechanism and moving the new paste cartridge to the paste cartridge mechanism.

15. The method of claim 12, wherein installing the new paste cartridge includes moving the new paste cartridge in a z-axis direction to seal an open end of the paste cartridge.

16. A paste dispensing transfer system of a stencil printer configured to print an assembly material on an electronic substrate, transfer system comprising:
   a paste cartridge mechanism coupled to a print head assembly of the stencil printer; and
   a rotary indexing mechanism coupled to a frame of the stencil printer,
   wherein the paste dispensing transfer system is configured to transfer a used paste cartridge from the print head assembly to the rotary indexing mechanism supported by the frame and to transfer a new paste cartridge from the rotary indexing mechanism to the print head assembly.

17. The transfer assembly of claim 16, wherein the rotary indexing mechanism includes a carousel mount configured to rotate, a paste cartridge tube holder mounted on a top surface of the carousel mount, and several dividers provided to separate the paste cartridges supported by the rotary indexing mechanism from each other.

18. The transfer assembly of claim 17, wherein the tube holder includes a half-wall that is configured to provide lateral support to a paste cartridge to maintain the paste cartridge in a vertical, upright position.

19. The transfer assembly of claim 17, wherein the rotary indexing mechanism is configured to be rotated to present an open receptacle defined between two adjacent dividers to receive the used paste cartridge and to be rotated to present a new paste cartridge to transfer to print head assembly.

20. The transfer assembly of claim 17, wherein the rotary indexing mechanism further includes a mounting bracket configured to secure the rotary indexing mechanism to a support member of the frame.

21. The transfer assembly of claim 20, wherein the rotary indexing mechanism further includes a motor and bearing housing secured to a bottom of the mounting bracket to secure a motor and gear box assembly, and a shaft coupled to the motor bearing housing and the carousel mount to drive the rotation of the carousel mount.

22. The transfer assembly of claim 17, wherein the paste cartridge mechanism includes a support bracket mounted on a support member of the print head assembly and an actuator secured to the support bracket to move the support bracket in a z-axis direction.

23. The transfer assembly of claim 22, wherein the support bracket includes an end effector having a base with a receiving feature designed to receive a bottom portion of the nozzle of the paste cartridge, the end effector being configured to selectively engage and secure the nozzle of the paste cartridge and maintain the paste cartridge in the vertical, upright position.

24. The transfer assembly of claim 23, wherein the support bracket is secured to the support member of the print head assembly by at least one linear bearing to enable the movement of the support bracket, actuator and end effector in the x-axis direction and is driven by a timing belt.

25. The transfer assembly of claim 23, wherein the actuator is configured to move the paste cartridge upwardly so that an open end of the paste cartridge is sealed by a cartridge sealing feature of the print head assembly.

26. The transfer assembly of claim 23, wherein the end effector includes a receiving feature having two spaced-apart prongs that are sized to surround a narrow cylindrical portion of the nozzle of the paste cartridge to enable the end effector to support the paste cartridge in the upright, vertical position.

* * * * *